(12) United States Patent
Yoshida et al.

(10) Patent No.: US 8,447,422 B2
(45) Date of Patent: May 21, 2013

(54) SUBSTRATE PROCESSING APPARATUS, SUBSTRATE PROCESSING METHOD, AND STORAGE MEDIUM

(75) Inventors: Masahiro Yoshida, Kumamoto (JP); Kouji Takuma, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 291 days.

(21) Appl. No.: 12/896,236

(22) Filed: Oct. 1, 2010

(65) Prior Publication Data
US 2011/0082579 A1 Apr. 7, 2011

(30) Foreign Application Priority Data
Oct. 5, 2009 (JP) ................................ 2009-231969

(51) Int. Cl.
*G06F 19/00* (2006.01)

(52) U.S. Cl.
USPC ........... 700/101; 700/112; 700/228; 700/113; 700/121

(58) Field of Classification Search
None
See application file for complete search history.

(56) References Cited

U.S. PATENT DOCUMENTS

| | | | | |
|---|---|---|---|---|
| 5,687,085 A | * | 11/1997 | Morimoto et al. | 700/121 |
| 6,074,443 A | * | 6/2000 | Venkatesh et al. | 29/25.01 |
| 6,564,113 B1 | * | 5/2003 | Barto et al. | 700/99 |
| 6,662,076 B1 | * | 12/2003 | Conboy et al. | 700/214 |
| 6,763,277 B1 | * | 7/2004 | Allen et al. | 700/100 |
| 6,788,985 B2 | * | 9/2004 | Mitsutake et al. | 700/97 |
| 7,221,993 B2 | * | 5/2007 | Rice et al. | 700/112 |
| 7,571,020 B2 | * | 8/2009 | Schmidt | 700/101 |
| 7,651,306 B2 | * | 1/2010 | Rice et al. | 414/217 |
| 8,070,410 B2 | * | 12/2011 | Rebstock | 414/281 |
| 8,146,530 B2 | * | 4/2012 | Ishikawa et al. | 118/503 |
| 2001/0018623 A1 | * | 8/2001 | Yamagishi | 700/100 |
| 2001/0051837 A1 | * | 12/2001 | Tateyama et al. | 700/112 |
| 2002/0182040 A1 | * | 12/2002 | Kimura et al. | 414/331.04 |
| 2002/0198623 A1 | * | 12/2002 | Jevtic et al. | 700/228 |
| 2004/0020601 A1 | * | 2/2004 | Zhao et al. | 156/345.32 |
| 2005/0273191 A1 | * | 12/2005 | Englhardt et al. | 700/112 |
| 2006/0182535 A1 | * | 8/2006 | Rice et al. | 414/217 |
| 2006/0190118 A1 | * | 8/2006 | Teferra et al. | 700/112 |
| 2006/0241813 A1 | * | 10/2006 | Babu et al. | 700/255 |
| 2007/0059861 A1 | * | 3/2007 | Rice et al. | 438/107 |
| 2007/0124010 A1 | * | 5/2007 | Duffin et al. | 700/112 |
| 2007/0134078 A1 | * | 6/2007 | Rogers et al. | 414/281 |
| 2007/0147976 A1 | * | 6/2007 | Rice et al. | 414/217 |
| 2007/0250202 A1 | * | 10/2007 | Kaneko et al. | 700/121 |

(Continued)

FOREIGN PATENT DOCUMENTS

| | | |
|---|---|---|
| JP | 8-153765 A | 6/1996 |
| JP | 2003-173204 A | 6/2003 |
| JP | 2004-200708 A | 7/2004 |
| JP | 2008-34490 A | 2/2008 |

*Primary Examiner* — Kavita Padmanabhan
*Assistant Examiner* — Christopher E Everett
(74) *Attorney, Agent, or Firm* — Abelman, Frayne & Schwab

(57) ABSTRACT

Disclosed are a substrate processing apparatus, a substrate processing method, and a storage medium, which can process a normal substrate according to a normal schedule in parallel with a substrate to be processed in preference to other substrates. Processing block performs the same types of processes for substrates, carried therein from FOUP placing unit, by using process arms. When a priority substrate having a priority over other substrates are carried, control unit carries and processes the priority substrate in priority processing unit that can receive a next substrate among priority processing units to which a plurality of processing units are partially or wholly assigned, in preference to other substrates.

10 Claims, 20 Drawing Sheets

U.S. PATENT DOCUMENTS

| | | | |
|---|---|---|---|
| 2007/0276530 A1* | 11/2007 | Duffin et al. | 700/112 |
| 2007/0276531 A1* | 11/2007 | Teferra et al. | 700/112 |
| 2008/0086229 A1* | 4/2008 | Ueda et al. | 700/121 |
| 2010/0280654 A1* | 11/2010 | Rice et al. | 700/228 |
| 2011/0150607 A1* | 6/2011 | Hong et al. | 414/222.01 |
| 2011/0153062 A1* | 6/2011 | Hong et al. | 700/218 |

\* cited by examiner liquid processing apparatus 1 liquid processing unit 2

141a
141b liquid processing unit 2

FIG. 6 table for setting number of assignments

| number of sheets of wafers | 1 sheet | 2 sheets | 3 sheets | 4 sheets | 5 sheets | 6 sheets | 7 sheets | 8 sheets | 9 sheets | 10 sheets or more |
|---|---|---|---|---|---|---|---|---|---|---|
| reference number of assignments for priority processing units | 1 unit | 2 units | 3 units | 4 units | 5 units | 6 units | 7 units | 8 units | 9 units | 10 units | priority setting table

| priority | low | medium | high | highest |
|---|---|---|---|---|
| coefficient | 0.6 | 1.0 | 1.4 | 2.0 |

( Case 1 )
   25 sheets  priority medium
   10 units X 1.0 = 10 units ( Case 2 )
   25 sheets  priority low
   10 units X 0.6 = 6 units ( Case 3 )
   25 sheets  priority high
   10 units X 1.4 = 14 units ( Case 4 )
   25 sheets  priority highest
   10 units X 2.0 = 20 units ( Case 5 )
   5 sheets  priority medium
   5 units X 1.0 = 5 units ( Case 6 )
   5 sheets  priority low
   5 units X 0.6 = 3 units ( Case 7 )
   5 sheets  priority high
   5 units X 1.4 = 7 units
   → process by 5 units because number of priority wafers to be processed is exceeded.

processing time estimation table

| number of sheets of priority wafers \ number of priority processing units | 1 unit | 2 units | 3 units | 4 units | 5 units | 6 units | 7 units | 8 units | 9 units | 10 units | ... |
|---|---|---|---|---|---|---|---|---|---|---|---|
| 1 Sheet | T0101 | — | — | — | — | — | — | — | — | — | |
| 2 Sheets | T0201 | T0202 | — | — | — | — | — | — | — | — | |
| 3 Sheets | T0301 | T0302 | T0303 | — | — | — | — | — | — | — | |
| 4 Sheets | T0401 | T0402 | T0403 | T0404 | — | — | — | — | — | — | |
| 5 Sheets | T0501 | T0502 | T0503 | T0504 | T0505 | — | — | — | — | — | |
| 6 Sheets | T0601 | T0602 | T0603 | T0604 | T0605 | T0606 | — | — | — | — | |
| 7 Sheets | T0701 | T0702 | T0703 | T0704 | T0705 | T0706 | T0707 | — | — | — | |

SUBSTRATE PROCESSING APPARATUS, SUBSTRATE PROCESSING METHOD, AND STORAGE MEDIUM

This application is based on and claims priority from Japanese Patent Application No. 2009-231969, filed on Oct. 5, 2009 with the Japanese patent Office, the disclosure of which is incorporated herein in its entirety by reference.

TECHNICAL FIELD

The present disclosure relates to a technique for performing the same types of processes, such as a liquid processing or a surface process, on a substrate, for example, a semiconductor wafer, by using a plurality of processing units.

BACKGROUND

In general, processing in a process of manufacturing a semiconductor device or the like includes a liquid processing for removing particles or contaminants adhered to a substrate, for example, a semiconductor wafer (hereinafter referred to as "wafer"), by supplying the surface of the substrate with a process solution, such as a chemical solution or pure water.

As one of liquid processing apparatuses for performing such a liquid processing, there is a liquid processing apparatus that performs the liquid processing by placing substrates one by one on a spin chuck and supplying the surface of the substrate with a process solution while rotating the substrate. An example of this type of liquid processing apparatus includes a liquid processing apparatus having a plurality of liquid processing units capable of the same types of liquid processing, which improves the number of sheets of substrates processed per unit time (throughput of substrates) by carrying substrates to the plurality of liquid processing units by means of a common substrate carrying mechanism to thereby perform the liquid processing in parallel in the plurality of liquid processing units while continuously replacing the substrates. See Japanese Laid-Open Patent Publication No. 2008-034490 (e.g., paragraph 0020 and FIG. 1).

In such a liquid processing apparatus having a plurality of liquid processing units, a plurality of sheets of wafers contained in a substrate carrier, for example, an FOUP (Front-Opening Unified Pod), and carried into a factory are subjected to a predetermined sequence of liquid processing by taking out the wafers from the substrate carrier and introducing the taken wafers into the respective liquid processing units of the liquid processing apparatus in a predetermined sequence. Assuming that wafers contained in one FOUP corresponds to 1 lot, the liquid processing apparatus processes wafers in units of lots, based on a predetermined schedule, in normal operation conditions.

In some cases, however, there may be a need to urgently process unscheduled wafers contained in another FOUP, for example, at the request of a customer or for reasons of production controls, process tests, and the like. In a conventional solution, this urgent processing for the unscheduled wafers has been performed, for example, in such a manner as to wait until a liquid processing for a currently processed lot is ended and then start to preferentially process the lot of wafers to be urgently processed (hereinafter referred to as "priority lot") before starting to process a next lot, or in such a manner as to completely stop the liquid processing for a currently processed lot and then start to process a priority lot.

According to this conventional solution, in the case of waiting until a liquid processing for a currently processed lot is ended, it is impossible to sufficiently meet the need for urgent processing because a point of time of starting to process a priority lot is delayed. Also, when a liquid processing for a currently processed lot is stopped for the moment and a priority lot intervenes, there occur unusual operations, such as an operation of stopping the currently processed lot or an operation of returning to the liquid processing after processing the priority lot, and thus there may be a fear of causing defects by failures in these unusual operations.

In Japanese Laid-Open Patent Publication No. Hei08-153765 (e.g., paragraphs 0146 to 0168 and FIGS. 20 to 28), a technique is disclosed which suppresses a lowering of throughput from being caused by a change in lots in a substrate processing apparatus for performing a series of processes for wafers, such as a process of coating or developing a resist film or the like, even when a priority lot having a different process flow intervenes. However, since this technique is also common to the above-mentioned liquid processing apparatus in that a processing for a currently processed lot must be stopped, it cannot solve the above problem with an operation of stopping or resuming the processing of a currently processed lot.

SUMMARY

According to an embodiment of the present disclosure, there is provided a substrate processing apparatus including: a substrate carrying-in block including a carrier placing unit on which a plurality of substrate carriers each containing at least a substrate are placed, and a transfer mechanism to transfer the at least a substrate for the substrate carriers placed on the carrier placing unit; a processing block including a plurality of processing units to perform the same types of processes for the substrate carried therein from the substrate carrying-in block, and a substrate carrying unit to carry the substrate between the substrate carrying-in block and the respective processing units; and a control unit to output a control signal to a priority processing unit that can receive a next substrate among priority processing units to which a part or all of the plurality of processing units are assigned, so as to control the priority processing unit to receive and process a priority substrate in preference to other substrates when the priority substrate having a priority over other substrates are carried onto the carrier placing unit by means of the substrate carrier.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a first view for explaining a way to determine the number of processing units to be assigned to priority processing units.

FIG. 21 is a twelfth view for explaining an operation of the liquid processing apparatus.

DETAILED DESCRIPTION

Figure 1:
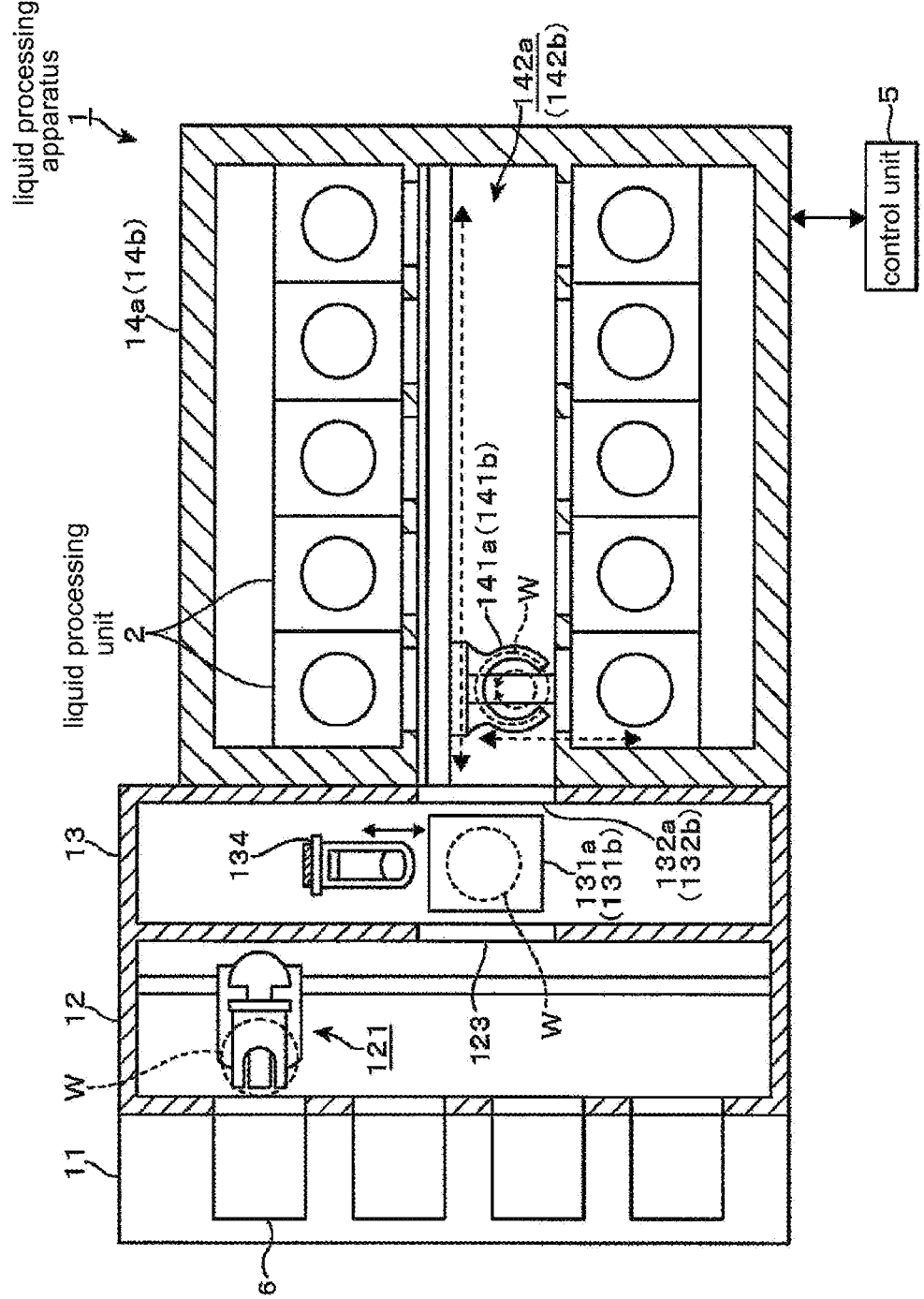
FIG. 1 is a cross-sectional plan view of a liquid processing apparatus according to an exemplary embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure has been made in view of and in order to solve at least the above-mentioned problems occurring in the prior art, and the present disclosure provides a substrate processing apparatus and method capable of processing substrates having priority over other substrates in parallel with substrates processed according to a normal schedule, and a storage medium in which the substrate processing method is stored.

The substrate processing apparatus may have the following features:

(a) The processing units are assigned to the priority processing units after the substrate carrier containing the priority substrates is placed on the carrier placing unit.

(b) The processing units to be assigned to the priority processing units are predetermined before the substrate carrier containing the priority substrates is placed on the carrier placing unit.

(c) The number of the priority processing units varies according to the number of sheets of priority substrates.

(d) A memory unit is provided to store data for matching the priority of processing of the priority substrates to the number of the priority processing units, the priority substrates are allocated the priority, and the control unit changes the number of the priority processing units according to the priority of processing of the priority substrates within the substrate carrier.

(e) Allowed processing time allowed to process the priority substrates is determined, and the control unit acquires the allowed processing time for the priority substrates and determines the number of the processing units to be assigned to the priority processing units (the number of assignments) in such a manner as to approximate the actual processing time to the allowed processing time, based on estimated processing time stored in correspondence to the number of the priority processing units.

According to the present disclosure, a plurality of processing units capable of processing the same types of processes in parallel are partially or wholly assigned to priority processing units, and priority substrates, the processing of which needs to be started in preference to other substrates, are processed in the priority processing units. When other processing units are left, substrates other than the priority substrates can also be processed in parallel with the priority substrates in the remaining processing units. On account of this, it is not necessary to delay the start of one of processing of the normal substrates and processing of the priority substrates until the other processing is completed or perform special operations of stopping and resuming processing of other substrates (normal substrates) in order to process the priority substrates, and it is possible to quickly start to process the priority substrates when needed.

According to an embodiment, there is provided a substrate processing apparatus including: a substrate carrying-in block including a carrier placing unit on which a plurality of substrate carriers each containing at least a substrate, and a transfer mechanism to transfer the at least a substrate for the substrate carriers placed on the carrier placing unit; a processing block including a plurality of processing units to perform the same types of processing for the substrate carried therein from the substrate carrying-in block, and a substrate carrying unit to carry the substrate between the substrate carrying-in block and the respective processing units; and a control unit to output a control signal to a priority processing unit that can receive a next substrate among priority processing units to which a part or all of the plurality of processing units are assigned, so as to control the priority processing unit to receive and process a priority substrate in preference to other substrates when the priority substrate having a priority over other substrates are carried onto the carrier placing unit by means of the substrate carrier.

In particular, the processing units are assigned to the priority processing units after the substrate carrier containing the priority substrate is placed on the carrier placing unit, and the processing units to be assigned to the priority processing units is predetermined before the substrate carrier containing the priority substrate is placed on the carrier placing unit, and the number of the priority processing units varies according to the number of sheets of priority substrates.

Moreover, the substrate processing apparatus further comprises a memory unit to store data for matching priority of processing of the priority substrate to the number of the priority processing units, wherein the priority substrate is assigned to the priority substrate, and the control unit changes the number of the priority processing units according to the priority of processing of the priority substrate within the substrate carrier. Also, the allowed processing time allowed to process the priority substrate is determined, and the control unit acquires the allowed processing time for the priority substrate and determines the number of the processing units to be assigned to the priority processing units in such a manner as to approximate actual processing time to the allowed processing time, based on estimated processing time stored in correspondence to the number of the priority processing units.

According to another embodiment, there is provided a substrate processing method including steps of taking out a substrate from a substrate carrier placed on a carrier placing unit on which a plurality of substrate carriers each containing at least a substrate are placed, and carrying the taken out substrate into a processing unit thereby processing the substrate in the processing unit; placing another substrate carrier containing a priority substrate having a priority over the substrate on another carrier placing unit different from the carrier placing unit on which the substrate carrier containing the substrate is placed; and carrying and processing the priority substrate in a priority processing unit that can receive a next substrate among priority processing units to which a part or all of the plurality of processing units are assigned, prior to the substrate, and processing the substrate in parallel in the processing units other than the priority processing unit.

The substrate processing method further includes assigning a part or all of the plurality of processing units to the priority processing units after the substrate carrier containing the priority substrate is placed on the carrier placing unit, and predetermining the processing units, which are to be assigned to the priority processing units, before the substrate carrier containing the priority substrate is placed on the carrier placing unit.

According to yet another embodiment, there is provided a storage medium storing a computer program for use in a substrate processing method using a plurality of processing units to perform the same types of processes for substrates, the computer program comprising steps to execute the substrate processing method as described above.

Figure 2:
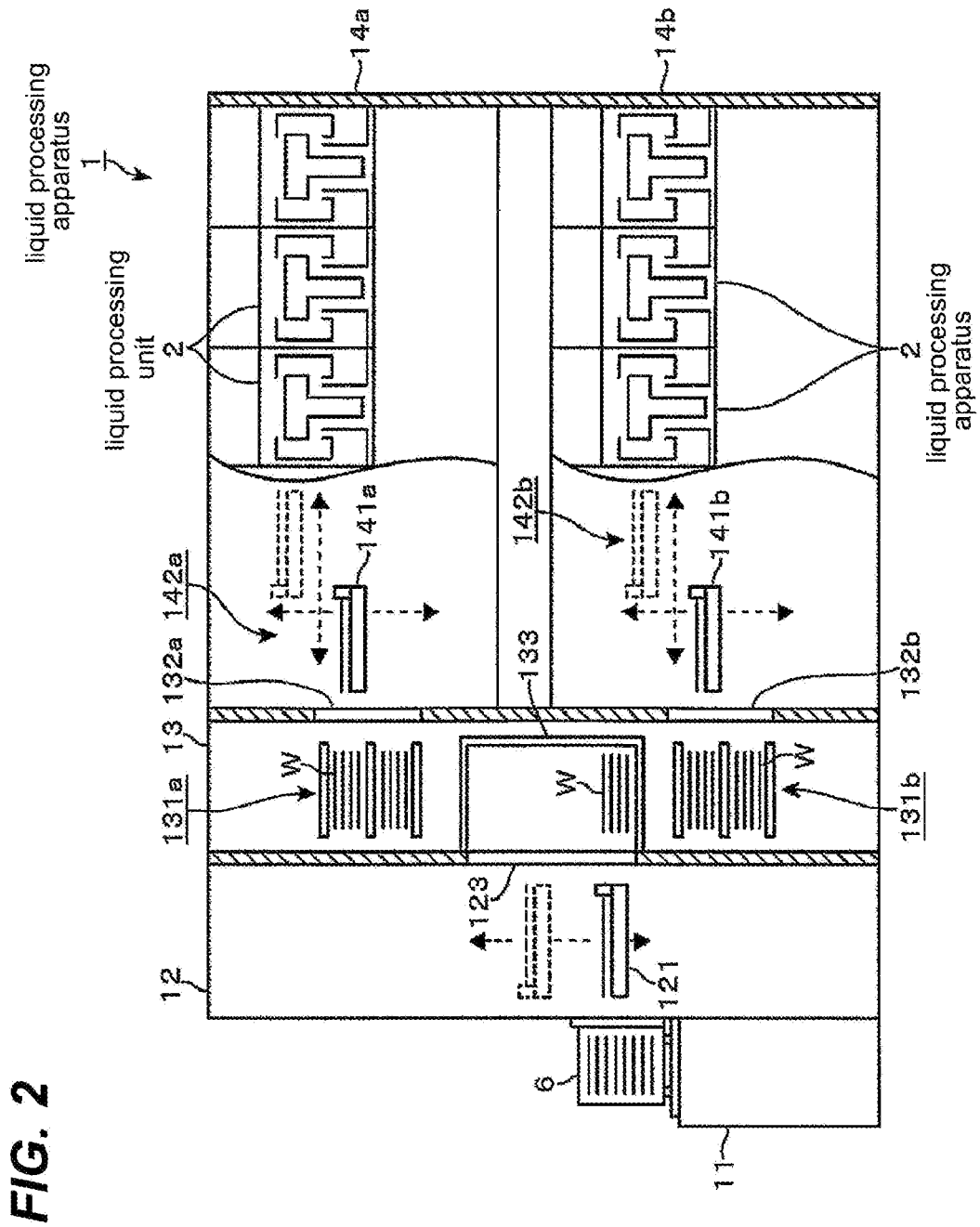
FIG. 2 is a vertical sectional side view of the liquid processing apparatus.

As an exemplary embodiment according to a substrate processing apparatus of the present disclosure, reference will now be made in detail to the configuration of a liquid processing apparatus 1 that performs a liquid processing for removing particles or contaminants adhered to a wafer W, that is, a substrate, by supplying wafer W with a chemical solution, that is, a process solution, with reference to FIGS. 1 to 5. FIGS. 1 and 2 are cross-sectional plan and vertical sectional side views illustrating the overall configuration of liquid processing apparatus 1 respectively. Assuming that the left sides of FIGS. 1 and 2 correspond to the front of liquid processing apparatus 1, liquid processing apparatus 1 is so configured that a FOUP placing unit 11 on which FOUPs 6, substrate carrier containing a plurality of wafers W, for example, each capable of carrying a maximum of 25 sheets of wafers W, are placed, a carrying unit 12 to take out wafers W from FOUPs 6 and carry them into liquid processing apparatus 1, a transfer unit 13 to transfer wafers W, taken out by carrying unit 12, to liquid processing blocks 14a, 14b at the rear end, and liquid processing blocks 14a, 14b to introduce wafers W, transferred from transfer unit 13, into liquid processing units 2 and perform liquid processing in liquid processing units 2 are connected in that order from the front to rear of liquid processing apparatus 1. Further, liquid processing apparatus 1 according to this embodiment includes two liquid processing blocks 14a, 14b disposed one above the other.

FOUP placing unit 11 is formed as a FOUP placement stage on which, for example, 4 FOUPs 6 can be placed, and serves as a carrier placing unit that fixes each FOUP 6 placed on the placement stage and connects it to carrying unit 12. Carrying unit 12 has a structure in which an opening/closing mechanism (not shown) to open/close an opening/closing door provided in a connecting plane to each FOUP 6 and a carrying-in/out arm 121 corresponding to a transfer mechanism to transfer wafer W between FOUP 6 and transfer unit 13 are installed within a common case.

Carrying-in/out arm 121 includes a carrying arm configured to be able to, for example, advance forward/retreat backward, move leftward and rightward, rotate, and rise upward/fall downward, and a driving unit for driving the carrying arm, and serves to transfer wafer W between carrying unit 12 and transfer unit 13 through a first opening 123 provided in a partition wall between carrying unit 12 and transfer unit 13.

Transfer unit 13 corresponds to the inner space of a case provided in a position where the front and rear ends of the case are fitted into carrying unit 12 and liquid processing blocks 14a, 14b, and have a structure in which, for example, a first transfer rack 133 connected to first opening 123 on the side of carrying unit 12, and second racks 131a, 131b provided above and below first transfer rack 133 respectively for transferring non-solution-treated and solution-treated wafers W between first transfer rack 133 and second openings 132a, 132b provided in a partition wall on the sides of respective liquid processing blocks 14a, 14b are included in the inner space of the case. For example, 8 sheets of wafers W may be placed in each second transfer rack 131a, 131b.

Further, as shown in FIG. 1, an elevation carrying mechanism 134 configured to be able to rise upward/fall downward and advance forward/retreat backward is installed within transfer unit 13. Elevation carrying mechanism 134 serves to carry wafer W between first transfer rack 133 and second transfer racks 131a, 131b. FOUP placing unit 11, carrying unit 12, and transfer unit 13 as described above constitute a substrate carrying-in block of liquid processing apparatus 1 according to this embodiment.

At the rear end of transfer unit 13, two liquid processing blocks 14a, 14b disposed one above the other are arranged adjacent to transfer unit 13. These liquid processing blocks 14a, 14b have the substantially same configuration, and have a structure in which a plurality of liquid processing units, for example, 10 liquid processing units 2, for performing liquid processing for wafers W are arranged within a case. Each liquid processing block 14a, 14b is provided with a carrying passage 142a, 142b for wafers W, which extends in a forward and backward direction, and arrays of 5 liquid processing units 2 are arranged opposite to each other on both left and right sides with respect to carrying passage 142a, 142b.

Figure 3:
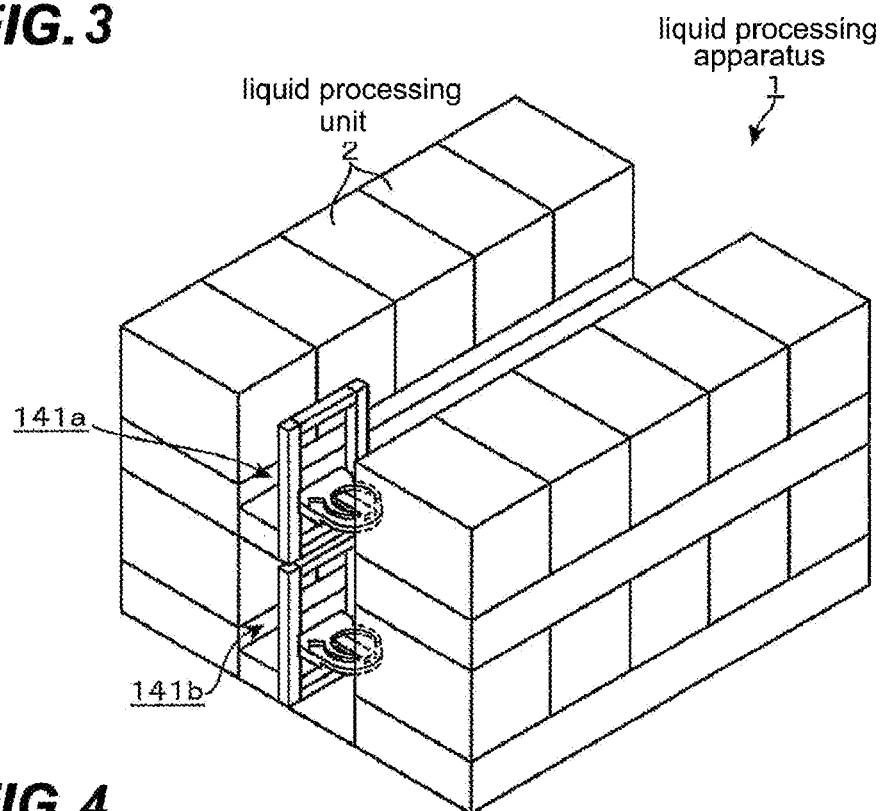
FIG. 3 is a perspective view illustrating the internal configuration of the liquid processing apparatus.

As shown in FIGS. 1 to 3, a process arm 141a, 141b configures to be able to move along carrying passage 142a, 142b, advance/retreat toward/from respective liquid processing units 2 provided in the left and right sides of carrying passage 142a, 142b, rotate about a vertical axis, and rise upward/fall downward, and corresponding to a substrate carrying unit of liquid processing apparatus 1 according to this embodiment is installed within each carrying passage 142a, 142b, and can carry wafer W between second transfer rack 131a, 131b on the side of transfer unit 13, corresponding to each liquid processing block 14a, 14b, and respective liquid processing units 2. Although FIGS. 1 to 3 illustrate an example where one process arm 141a, 141b is provided for each liquid processing block 14a, 14b, two or more process arms 141a, 141b may be provided according to the number of liquid processing units 2, and so forth.

Figure 4:
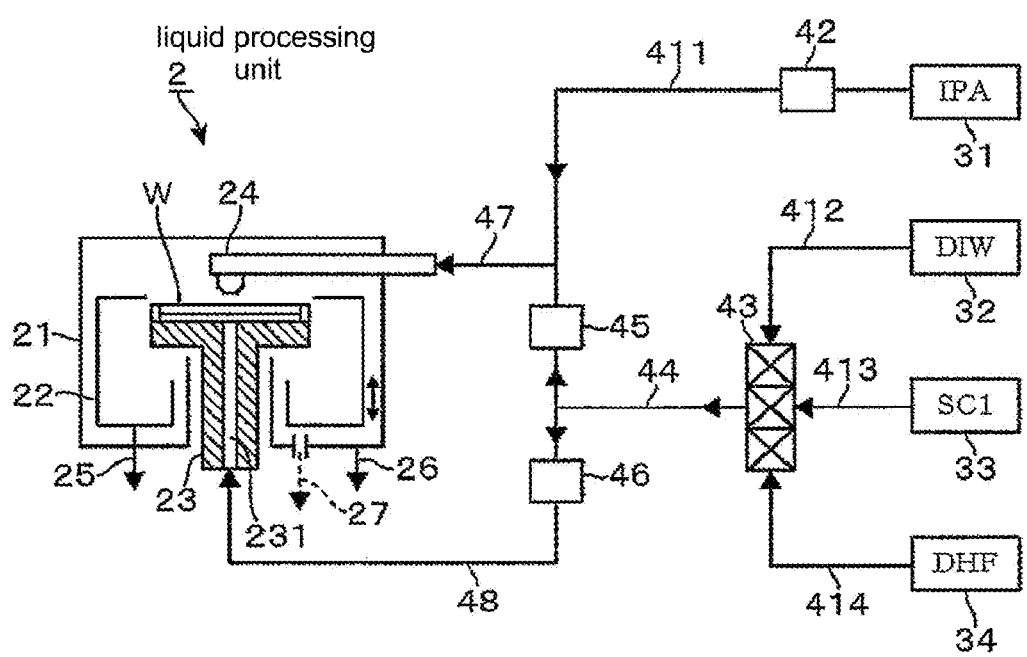
FIG. 4 is a view for explaining the configuration of a liquid processing unit mounted in the liquid processing apparatus.

Hereinafter, liquid processing unit 2 installed in each liquid processing block 14a, 14b will be described in detail with reference to FIG. 4. Liquid processing unit 2 includes an outer chamber 21 forming a hermetically sealed process space in which each processing for wafer W including a liquid processing, rinse washing, and shaking-off drying is performed, a wafer retaining mechanism 23 provided within outer chamber 21 and rotating wafer W while retaining wafer W in a substantially horizontal state, a nozzle arm 24 supplying a chemical solution onto the upper surface side of wafer W retained by wafer retaining mechanism 23, and an inner cup 22 for catching the chemical solution splashed around from rotating wafer W, which is provided within outer chamber 21 in such a manner as to surround wafer retaining mechanism 23.

As shown in FIGS. 1 to 3, outer chamber 21 is installed within a case separating corresponding liquid processing unit 2 from other adjacent liquid processing units 2, and wafer W is carried into/out of outer chamber 21 through a wafer carrying-in/out port (not shown) by means of process arm 141a, 141b. Reference numeral "26" designates a drain line provided in the bottom of outer chamber 21 for discharging drainage water, such as DIW, collected in the bottom of outer chamber 21, and reference numeral "27" designates an exhaust line for exhausting an atmosphere within outer chamber 21. Further, wafer retaining mechanism 23 is formed with a chemical solution supply passage 231 through which a chemical solution can be supplied onto the lower surface of rotating wafer W.

Nozzle arm 24 has a chemical solution supply nozzle at its leading end, and can move the chemical solution supply nozzle between a position above the center of wafer W retained on wafer retaining mechanism 23 and a standby position located, for example, outside of outer chamber 21. Inner cup 22 rises and falls between a processing position where inner cup 22 surrounds wafer W retained on wafer retaining mechanism 23 and a retreat position where inner cup 22 is retreated downward from the processing position, and serves to catch various chemical solutions supplied onto the surface of wafer W and discharge these chemical solutions out of liquid processing unit 2 through a solution drain line 25 provided in the bottom of inner cup 22.

Reference will now be made in detail to a mechanism for supplying each liquid processing unit with a chemical solution. The nozzle provided in nozzle arm 24 is connected to an upper surface side supply line 47, and upper surface side supply line 47 is branched off into an IPA supply line 411 and an intermediate chemical solution supply line 44. IPA supply line 411 is connected to an IPA supply source 31 that serves to supply the upper surface side of wafer W with IPA for drying wafer W by use of its high volatility. IPA supply line 411 is provided with a mass flow controller 42 that allows nozzle arm 24 to be supplied with a predetermined amount of IPA.

Intermediate chemical solution supply line 44 further branched off from upper surface side supply line 47 is connected to three series chemical solution supply lines 412, 413, 414, that is, a DIW supply line 412, an SCI supply line 413, and a DHF supply line 414. A DIW supply source 32 for supplying a rinse solution called DIW (DeIonized Water), which removes a DHF solution or SCI solution left on wafer W after chemical liquid processing, is provided upstream of DIW supply line 412. Further, an SCI supply source 33 for supplying a chemical solution called an SCI solution (a mixture solution of ammonia and hydrogen peroxide), which removes particles or organic contaminants from the surface of wafer W, is provided upstream of SCI supply unit 413. Finally, a DHF supply source 34 for supplying an acidic chemical solution called a diluted hydrofluoric acid aqueous solution (hereinafter referred to as "DHF solution"), which removes natural oxide films on the surface of wafer W, is provided upstream of DHF supply line 414.

Intermediate chemical solution supply line 44 to which DIW supply line 32, SCI supply line 33, and DHF supply line 34 are connected is also connected to chemical solution supply passage 231, which supplies chemical solutions onto the lower surface of wafer W, via a lower surface side supply line 48. In FIG. 4, reference numerals "45" and "46" designate mass flow controllers for adjusting the amount of chemical solutions supplied to nozzle arm 24 and wafer retaining mechanism 23 respectively.

As shown in FIG. 1, a control unit 5 is further connected to liquid processing apparatus 1. Control unit 5 is formed by a computer including, for example, a CPU and a memory, and a program formed by control step (command) groups regarding the function of liquid processing apparatus 1, that is, a series of operations from carrying wafer W into liquid processing unit 2 of each liquid processing block 14a, 14b and performing a liquid processing to bringing wafer W into FOUP 6 after the liquid processing, is recorded in the memory. This program is stored in a memory medium, such as a hard disk, a compact disk, a magnetic optical disk, or a memory card, and is installed in the computer from the memory medium.

Liquid processing apparatus 1 as described above is configured to immediately start to process wafers W of priority lot (hereinafter referred to "priority wafer(s) WP") and continue to perform a liquid processing for wafers W of preceding lot in parallel with priority wafers WP, for example, when the priority lot to be urgently processed in preference to other lots occurs. Hereinafter, this function of liquid processing apparatus 1 will be described in detail.

Figure 5:
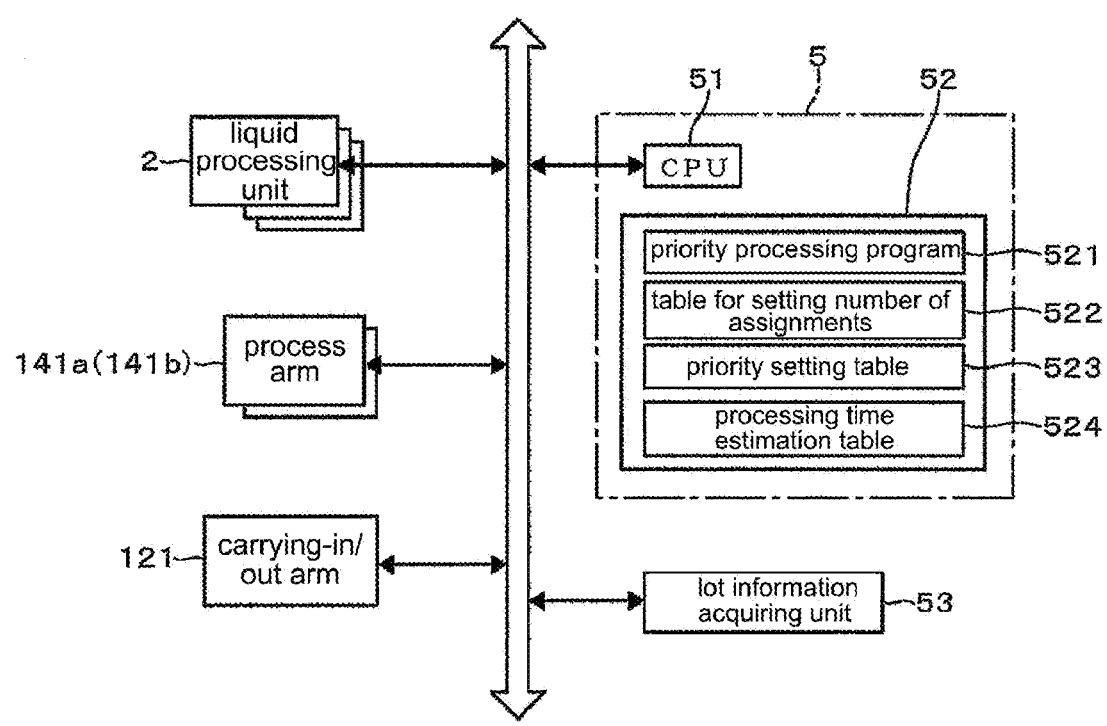
FIG. 5 is a view for explaining the electric configuration of the liquid processing apparatus.

FIG. 5 is a block diagram illustrating an electric configuration of liquid processing apparatus 1. As shown in FIG. 1, each liquid processing unit 2, process arms 141a, 141b, or carrying-in/out arm 121 is connected to control unit 5 as described above (for example, including a CPU 51 and a memory 52).

A lot information acquiring unit 53 is further connected to control unit 5, and thus information on the number of sheets of priority wafers WP within FOUP 6 containing a priority lot or the priority of the priority lot and information on processing time allowed until processing of the priority lot is completed can be acquired. Lot information acquiring unit 53 may be formed as a data input module, for example, a touch panel through which an operator of liquid processing apparatus 1 directly inputs the above-mentioned information, and may also be formed as a data readout module to read out information from, for example, an IC tag attached to FOUP 6 or a barcode printed on the outer surface of FOUP 6. Further, lot information acquiring unit 53 may be formed as a data reception module to acquire the above-mentioned information by using a communication means external to liquid processing apparatus 1, and may also acquire the above-mentioned information in any other manner.

Memory 52 of control unit 5 stores, for example, a priority processing program 521 to assign a part or all of a total of 20 liquid processing units 2 installed in liquid processing blocks 14a, 14b to priority processing units 2P for processing priority wafers WP and perform liquid processing in parallel for priority wafers WP and normal wafers W in respective processing units 2, 2P.

In this embodiment, lot information acquiring unit 53 acquires information on the number of sheets of priority wafers WP, for example, for all priority lots, but may acquire either information on priority or information on allowed processing time according to the necessity of an input side. Further, memory 52 stores, for example, a table 522 for setting the number of assignments, a priority setting table 523, or a processing time estimation table 524. When neither information on priority nor information on allowed processing time is acquired or when information on priority is acquired, the number of liquid processing units 2 to be assigned to priority processing units 2P is determined using table 522 for setting the number of assignments and priority setting table 523. In contrast, when information on allowed processing time is acquired, the number of liquid processing units 2 to be assigned to priority processing units 2P is determined using processing time estimation table 524.

FIG. 6 is a view for explaining table 522 for setting the number of assignments, priority setting table 523, and a way to determine the number of assignments for priority processing units 2P by using these tables. The reference number of assignments, which is selected according to the number of sheets of priority wafers WP contained in FOUP 6 of priority lot, is stored in table 522 for setting the number of assignments. In table 522 for setting the number of assignments according to this embodiment, as many priority processing units 2P as priority wafers WP are assigned when the number of sheets of priority wafers WP is 1 to 9, and 10 priority processing units 2P are assigned when the number of sheets of priority wafers WP is 10 or greater.

With regard to 4 pieces of information "low, medium, high, and highest" representing the degree of priority, coefficients by which the selected reference number of assignments is multiplied is stored in priority setting table 523. For example, when 25 sheets of priority wafers WP corresponding to the maximum acceptable number of sheets are contained in FOUP 6 of priority lot, the reference number of assignments for priority processing units 2P is set to 10. Further, when neither information on priority nor information on allowed processing time is acquired (default state), or priority corresponds to "medium", the reference number of assignments is multiplied by a coefficient of "1.0", and thus the number of assignments for priority processing units 2 equals 10 (Case 1). Further, when priority corresponds to "low, high, and highest", the reference number of assignments "10" is multiplied by coefficients of "0.6, 1.4, and 2.0" respectively, and thus the number of assignments for priority processing units 2P equal "6, 14 and 20" respectively (Cases 2 to 4).

If the number of sheets of priority wafers WP contained in FOUP 6 is 5, then 5 priority processing units 2P are assigned for the default state or priority "medium", and 3 priority processing units 2P are assigned for priority "low" (Cases 5 and 6). For priority "high", 7 priority processing units 2P are assigned in calculation (the same is for priority "highest"), but in this case, as many priority processing units 2P as priority wafers WP are assigned because there is no priority wafer WP carried into the sixth or more priority processing unit 2P, even though priority processing units 2P exceeding the number of sheets of priority wafers WP contained in FOUP 6 are assigned (Case 7).

In this way, according to this embodiment, the more the number of sheets of priority wafers WP contained in FOUP 6 of priority lot or the higher the priority of the priority lot, the more priority processing units 2P are assigned. Further, when a value obtained by multiplying the reference number of assignments by a coefficient selected in priority setting table 523 has a fraction, the actual number of assignments may be determined, for example, by rounding the multiplication result off the nearest or next higher integer.

Figures 7, 8:
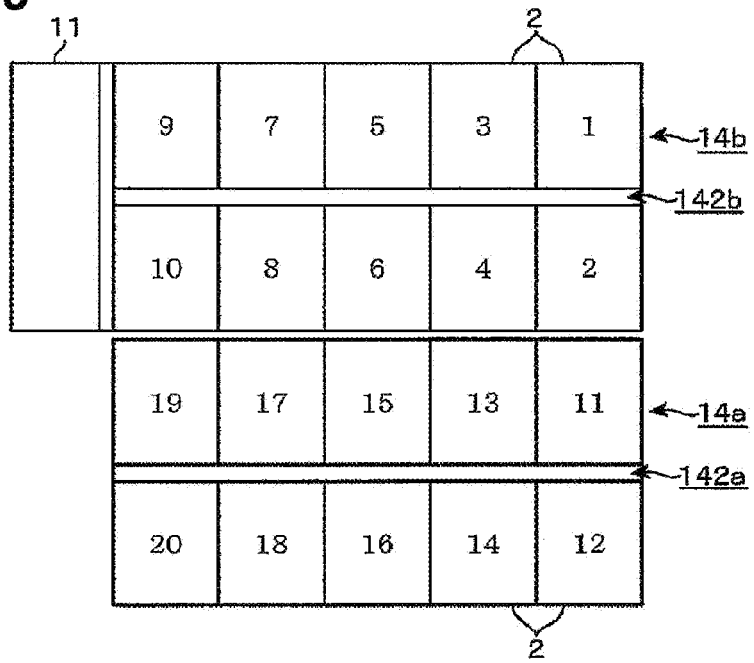
FIG. 7 is a second view for explaining a way to determine the number of processing units to be assigned to priority processing units.
FIG. 8 is a view for explaining the order of assigning processing units to priority processing units.

Hereinafter, a way to determine the number of assignments for priority processing units 2P based on allowed processing time acquired by lot information acquiring unit 53 will be described in detail with reference to FIG. 7. FIG. 7 illustrates an example of processing time estimation table 524, columns arranged in the horizontal direction of table 524 represent the number of assignments for priority processing units 2P, and rows arranged in the vertical direction of table 524 represent the number of sheets of priority wafers WP. Further, the approximate estimated processing time required when priority wafers WP having the corresponding number of sheet are processed by priority processing units 2P having the corresponding number of assignments is stored in a cell where each roe and each column intersect. For example, it can be noted that when liquid processing for 4 sheets of priority wafers WP are performed using 3 priority processing units, the approximate estimated processing time required until the liquid processing is completed is "$T_{0403}$".

In this way, processing time for each case of up to 25 sheets of priority wafers WP and up to 20 priority processing units 2P is stored in processing time estimation table 524. However, as already described in FIG. 6 (Case 7), cases where priority processing units 2P are assigned in excess of the number of sheets of priority wafers WP contained in FOUP 6 are left out of consideration, and these cases are indicated by "-" in FIG. 7.

Priority processing program 521 is programmed in such a manner to search for estimated processing time, for example, the estimated processing time nearest to allowed processing time, among the estimated processing times recorded in processing time estimation table 524 according to the number of sheets of priority wafers WP contained in FOUP 6 when information on the allowed processing time is acquired, and assign priority processing units 2P, the number of which corresponds to the searched estimated processing time. With regard to this, priority processing program 521 may search for the estimated processing time nearest to the allowed processing time, for example, within a range not exceeding the allowed processing time. Further, for example, when there is no estimated processing time satisfying the allowed processing time in processing time estimation table 524, priority processing program 521 may display an error message on a display unit provided in liquid processing apparatus 1, thereby urging an operator to modify the allowed processing time, or may receive information on priority, instead of the allowed processing time.

If the number of assignments for priority processing units 2P is determined using table 522 for setting the number of assignments, priority setting table 523, and processing time estimation table 524, as described above, then respective liquid processing units 2 are assigned to priority processing units 2P, for example, in order from the lowest to highest in terms of numbers given to respective liquid processing units 2, as schematically shown in FIG. 8. For example, when 10 liquid processing units 2 are assigned to priority processing units 2P, liquid processing units 1 to 10 are selected as priority processing units 2P.

In the schematic view of FIG. 8, upper two lines of columns (shown as connected to FOUP placing unit 11 from the top of the drawing represent liquid processing units 2(1) to 2(10) within liquid processing block 14b on the lower side of liquid processing apparatus 1, and next two lines of columns located therebelow represent liquid processing units 2(11) to 2(20) within liquid processing block 14a on the upper side of liquid processing apparatus 1. Further, the illustration of carrying unit 12, transfer unit 13, process arms 141a, 141b, and the like are omitted in FIG. 8. The configuration shown in this schematic view is the same in FIGS. 10 to 24 as describe below.

Liquid processing apparatus 1 having the above-mentioned configuration operates as follows. If liquid processing apparatus 1 starts to process wafer W, then carrying-in/out arm 121 takes out wafer W from FOUP 6 placed on FOUP placing unit 11, and places wafer W in first transfer rack 133. Elevation carrying mechanism 134 takes out wafers W from first transfer rack 133, and sequentially places wafers W in second transfer rack 131a, 131b matched to each liquid processing block 14a, 14b.

In each liquid processing block 14a, 14b, process arm 141a, 141b receives wafer W from second transfer rack 131a, 131b, enters one of liquid processing units 2, and transfers wafer W to wafer retaining mechanism 23. If wafer W is retained, nozzle arm 24 is moved up to a position above the center of wafer W, inner cup 22 is raised up to a processing position, and an SC1 solution is supplied onto both the upper and lower surfaces of wafer W from the nozzle and chemical solution supply passage 231 on the side of wafer retaining mechanism 23 while wafer W is rotated by wafer retaining mechanism 23. As a result, a solution film of the chemical solution is formed on wafer W, so that alkali chemical solution washing is performed.

Upon completion of the alkali chemical solution washing is completed, inner cup 22 is retreated to a retreat position, and rinse washing for removing the SC1 solution on the surface of wafer W is performed by supplying inner cup 22 and chemical solution passage 231 of wafer retaining mechanism 23 with DIW.

Upon completion of the rinse washing, wafer W is subjected to shaking-off drying, inner cup 22 is raised up to the processing position again, and a DHF solution is supplied onto both the upper and lower surfaces of wafer W from nozzle arm 24 and chemical solution supply passage 231 of wafer retaining mechanism 23 while wafer W is rotating. As a result, a solution film of the DHF solution is formed on both the upper and lower surfaces of wafer W, so that acidic chemical solution washing is performed. Further, after a predetermined time elapse, inner cup 22 is lowered up to the retreat position, and rinse washing is performed again by replacing the chemical solution series by pure water.

After the pure water rinse washing, inner cup 22 is raised up to the processing position, and IPA drying by use of the volatility of IPA is performed by rotating wafer W while supplying IPA onto the upper surface of liquid processing unit 2. As a result, pure water left on the surface of wafer W after the pure water rinse washing is completely removed. Subsequently, inner cup 22 is retreated up to the retreat position, the carrying-in/out port (not shown) is opened, and then process arm 141a, 141b enters liquid processing unit 2 to carry solution-treated wafer W out of liquid processing unit 2.

Wafer W for which the liquid processing is completed is transferred to second transfer rack 131a, 131b, elevation carrying mechanism 134, first transfer rack 133, and carrying-in/out arm 121 in the reverse path to that of wafer W carried into liquid processing unit 2, and finally is contained in FOUP 6 on FOUP placing unit 11.

Liquid processing apparatus 1 can operate a total of 20 liquid processing units 2 within two-stage upper and lower liquid processing blocks 14a, 14b in parallel to wash and dry wafers W by continuously performing the above-mentioned operation. Next, a procedure of carrying wafers W into these 20 liquid processing units 2 and performing liquid processing, and a procedure of assigning a part or all of liquid processing units 2 to priority processing units 2P, processing priority wafers WP in priority processing units 2P, and resuming processing for normal wafers W after processing for priority wafers WP is completed will be described in detail with reference to a flowchart of FIG. 9 and FIGS. 10 to 17. In each drawing of FIGS. 10 to 23 as described below, each FOUP 6 and each wafer W are identified by providing FOUPs 6 placed on FOUP placing unit 11 with reference numerals "A, B, C, . . . " and providing wafers W contained in these FOUPs 6 with reference numerals "A-1 to A-25, B-1 to B-25, C-1 to C-25, . . . " in order of their carrying to liquid processing units 2. Further, each liquid processing unit is identified by providing liquid processing units 2 with the same reference numerals "1 to 20" as those in FIG. 8. Further, in the following description, it will be assumed that 25 sheets of wafers W corresponding to the maximum number of sheets of wafers W are contained in each FOUP 6.

Figure 9:
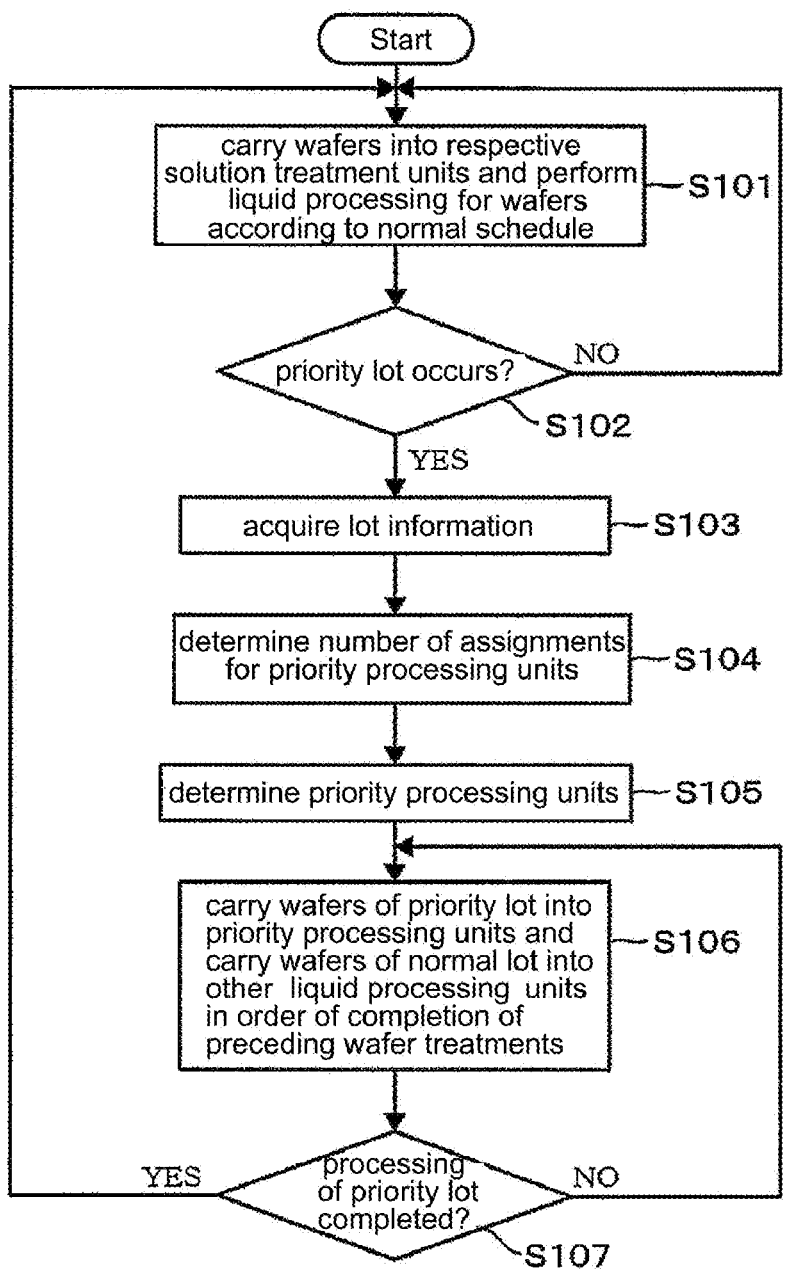
FIG. 9 is a flowchart illustrating an operation of processing a priority substrate in the liquid processing apparatus.

As shown in the flowchart of FIG. 9, if liquid processing apparatus 1 comes into operation (START), then it carries wafers W out of FOUPs 6 placed on FOUP placing unit 11, and performs a liquid processing for each wafer W based on normal schedule. In liquid processing apparatus 1 according to this embodiment, for example, when first FOUP 6(A) is placed on FOUP placing unit 11, first wafer W(A-1) is taken out from first FOUP 6(A), and is carried into and starts to be subjected to a liquid processing in, for example, innermost left liquid processing unit 2(1) of lower liquid processing block 14b, as seen from the front (see (a) of FIG. 10).

Figure 10A:
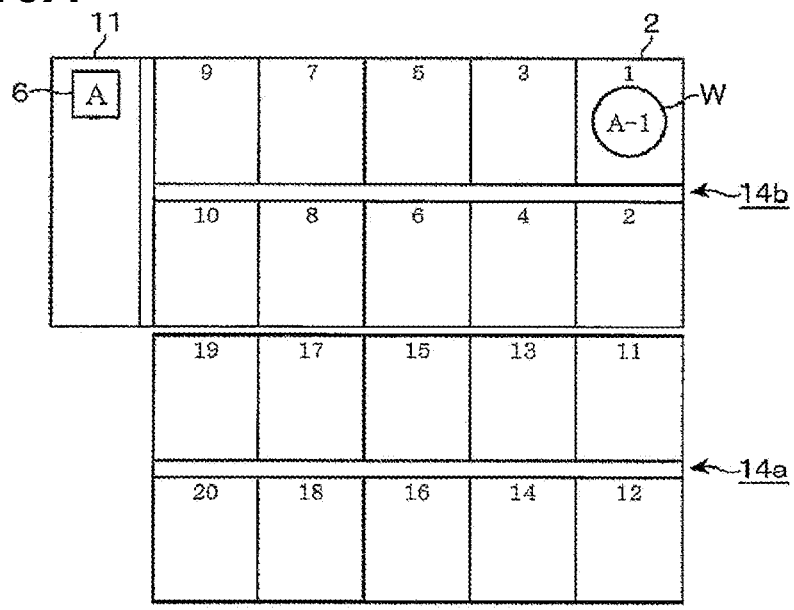
FIG. 10 is a first view for explaining an operation of the liquid processing apparatus.
Figure 10B:
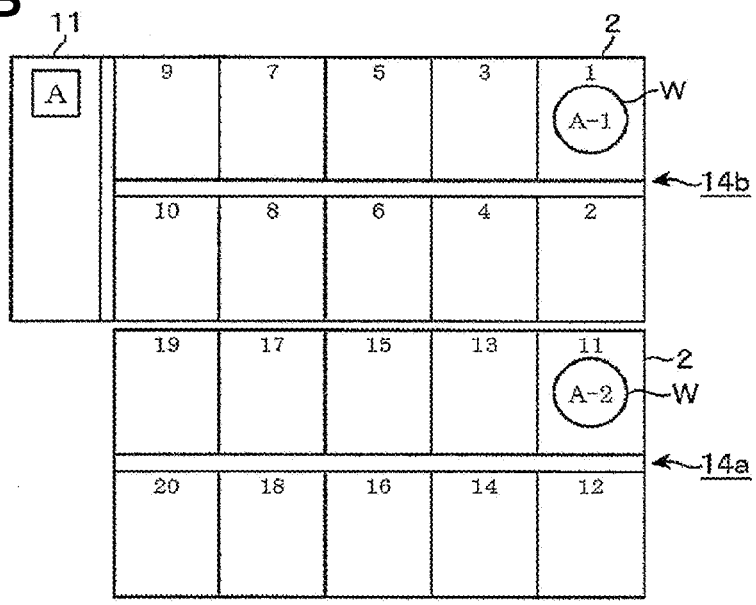
Figure 11A:
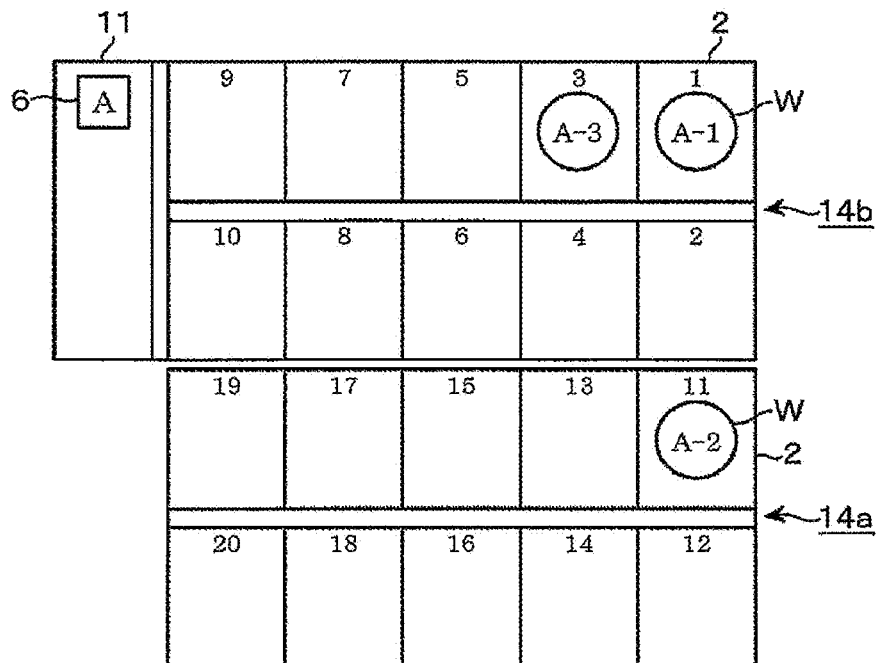
FIG. 11 is a second view for explaining an operation of the liquid processing apparatus.
Figure 11B:
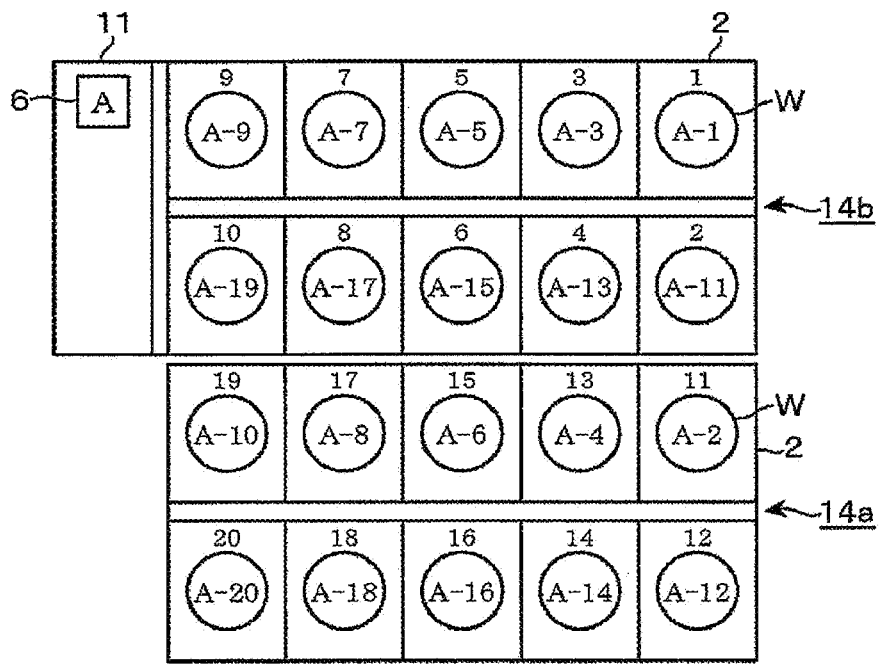

Subsequently, second wafer W(A-2) is carried into and starts to be subjected to a liquid processing in innermost left liquid processing unit 2(11) of upper liquid processing block 14a, as seen from the front (see (b) of FIG. 10), and third wafer W(A-3) is carried into and starts to be subjected to a liquid processing in second innermost left liquid processing unit 2(3) of lower liquid processing block 14b (see (a) of FIG. 11).

In this way, wafers W are alternately carried into respective liquid processing units 2 of the left two liquid processing unit lines of upper and lower liquid processing blocks 14a, 14b from the inside to the front. Subsequently, for the right two liquid processing unit lines, as seen from the front, wafers W are also alternately carried into respective liquid processing units 2 of upper and lower liquid processing blocks 14a, 14b from the inside to the front. As a result, liquid processing is performed for wafers W from A-1 to A-20 in liquid processing apparatus 1 in order of their carrying into liquid processing units 2, as shown in (b) of FIG. 11.

For example, assuming that the same processing time is required to perform a liquid processing for each wafer W in liquid processing unit 2, a liquid processing for wafer W is completed earliest in liquid processing unit 2(1) into which first wafer W(A-1) has been carried. Upon completion of the liquid processing for first wafer W(A-1), next wafer W(A-21) replacing first wafer W(A-1) is carried into and starts to be subjected to a liquid processing in liquid processing unit 2(1), as shown in (a) of FIG. 12. In this way, wafers W are replaced by next wafers W in respective liquid processing units 2 in order of completion of the liquid processing. In liquid processing apparatus 1, liquid processing is performed based on the above-mentioned wafer carrying schedule, so long as there is no need to process a priority lot (step S101 and S102; NO in the flowchart of FIG. 9).

Figure 12A:
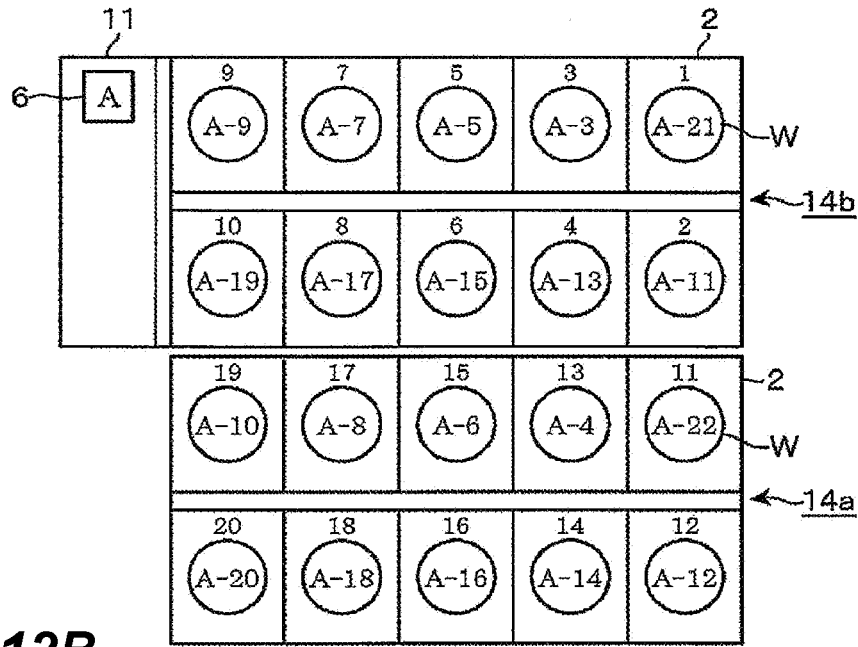
FIG. 12 is a third view for explaining an operation of the liquid processing apparatus.
Figure 12B:
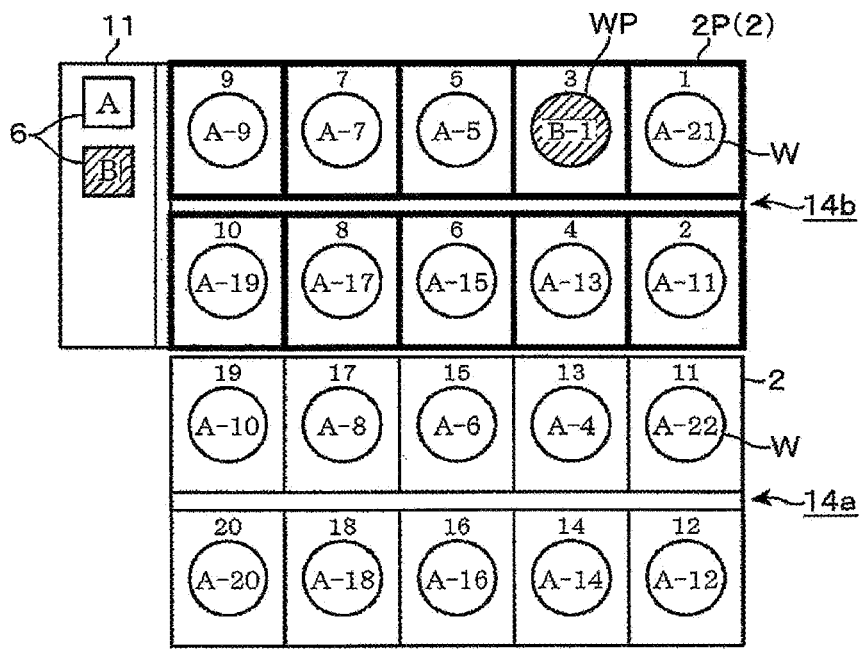

Here, a case will be considered where at a point of time when the carrying process of wafer W(A-22) into liquid processing unit 2(11) is completed as shown in (a) of FIG. 12, FOUP 6(B) of priority lot is placed on FOUP placing unit 11, as shown in (b) of FIG. 12 (step S102; YES in FIG. 9). In FIG.

12 and following drawings, FOUPs 6 of priority lot and priority wafers WP are distinguished from normal lots by right-upward oblique lines.

If FOUP 6(B) of priority lot is placed on FOUP placing unit 11, lot information acquiring unit 53 acquires information on the number of sheets of priority wafers WP of the priority lot, the priority of the priority lot, allowed processing time, or the like (step S103), and determines the number of liquid processing units 2 to be assigned to priority processing units 2P by the method described above with reference to FIG. 6 or FIG. 7 (step S104). Upon determination of the number of priority processing units 2P, respective liquid processing units 2 are selected as priority processing units 2P in order from the lowest to highest number indicated in FIG. 8 (step S105).

For example, when 10 liquid processing units 2 are assigned to priority processing units 2P, liquid processing units 2(1) to 2(10) of lower liquid processing block 14b, shown as enclosed by thick lines, are selected as priority processing units 2P. When based on the normal schedule, wafer W(A-23) is to be carried into next liquid processing unit 2(3) capable of receiving wafer W, but priority wafer WP(B-1) is carried into liquid processing unit 2(3) in preference to normal wafer W(A-23) because liquid processing unit 2(3) is priority processing unit 2P(3) (see (b) of FIG. 12).

Figure 13A:
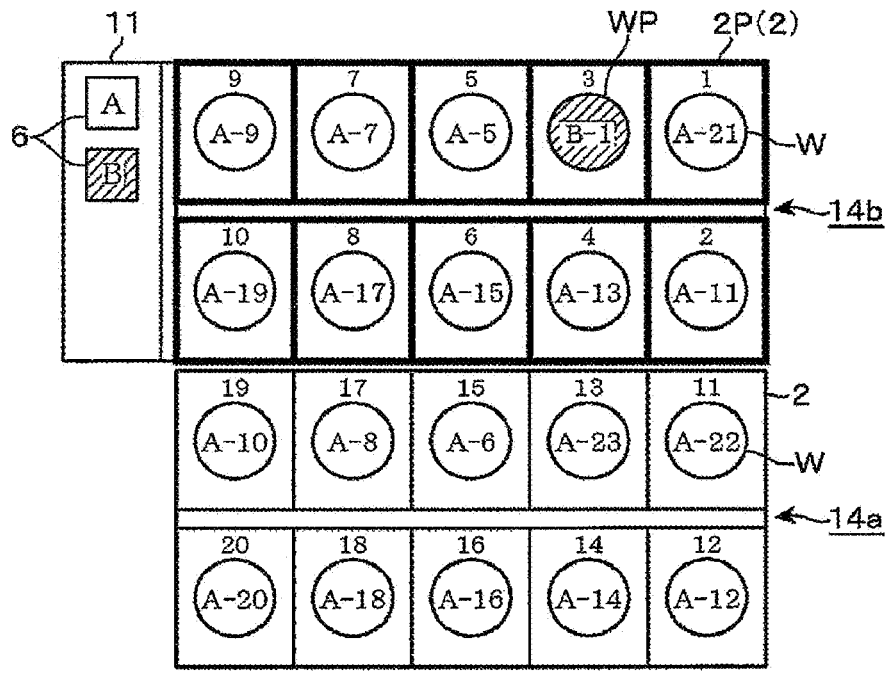
FIG. 13 is a fourth view for explaining an operation of the liquid processing apparatus.
Figure 13B:
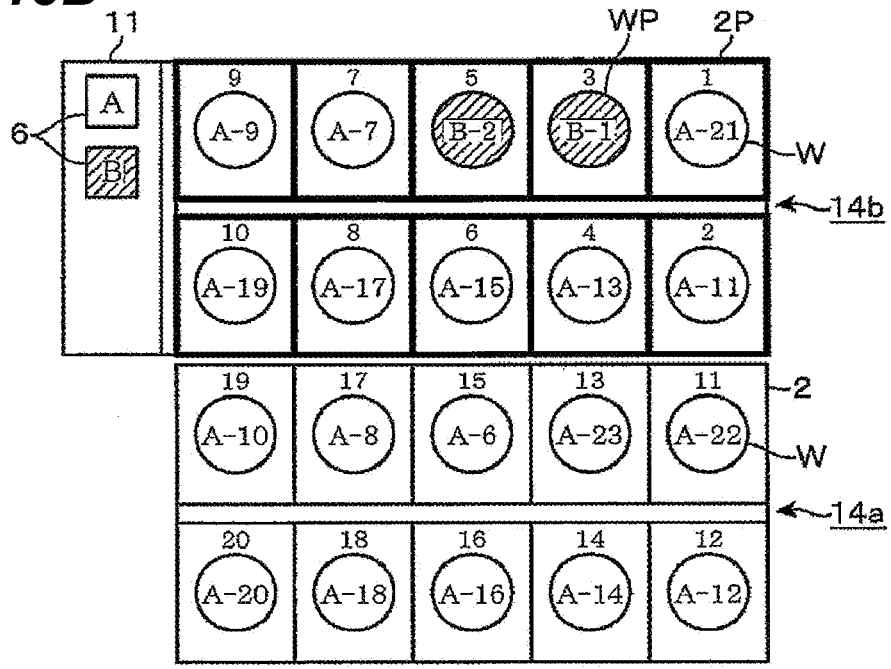

Subsequently, next liquid processing unit 2 capable of receiving wafer W is liquid processing unit 2(13) of upper liquid processing block 14a, and normal wafer W(A-23) is carried into and processed in liquid processing unit 2(13) because liquid processing unit 2(13) is not priority processing unit 2P (see (a) of FIG. 13). In this way, priority wafers WP are preferentially carried into priority processing units 2P of lower liquid processing block 14b, for example, priority wafer WP(B-2) is carried into priority processing unit 2P(5), as shown in (b) of FIG. 13, and normal wafers W are carried into liquid processing units 2 of upper liquid processing block 14a, for example, normal wafer W(A-24) is carried into liquid processing unit 2(15), as shown in (a) of FIG. 14 (step S106 in the flowchart of FIG. 9).

Figure 14A:
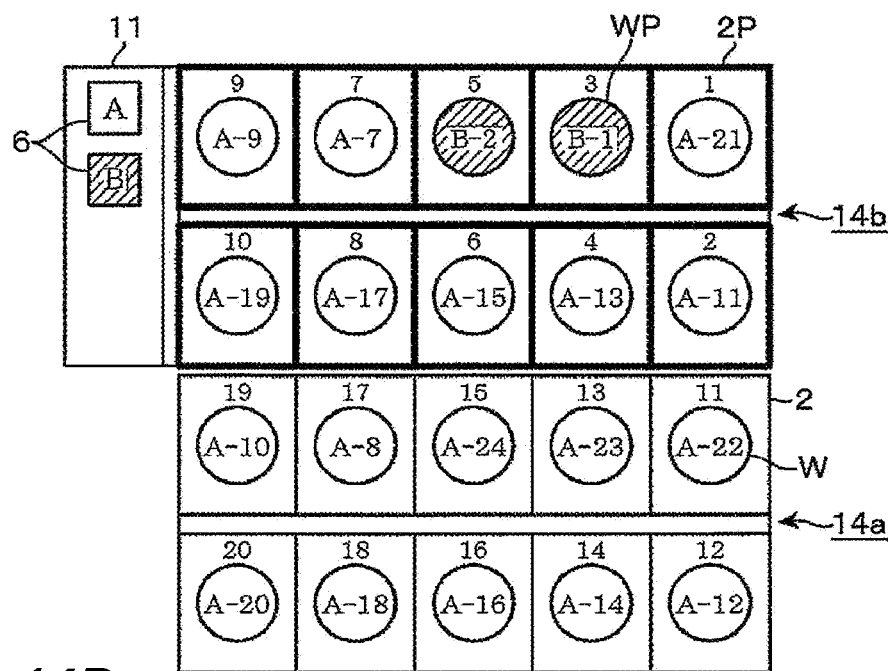
FIG. 14 is a fifth view for explaining an operation of the liquid processing apparatus.
Figure 14B:
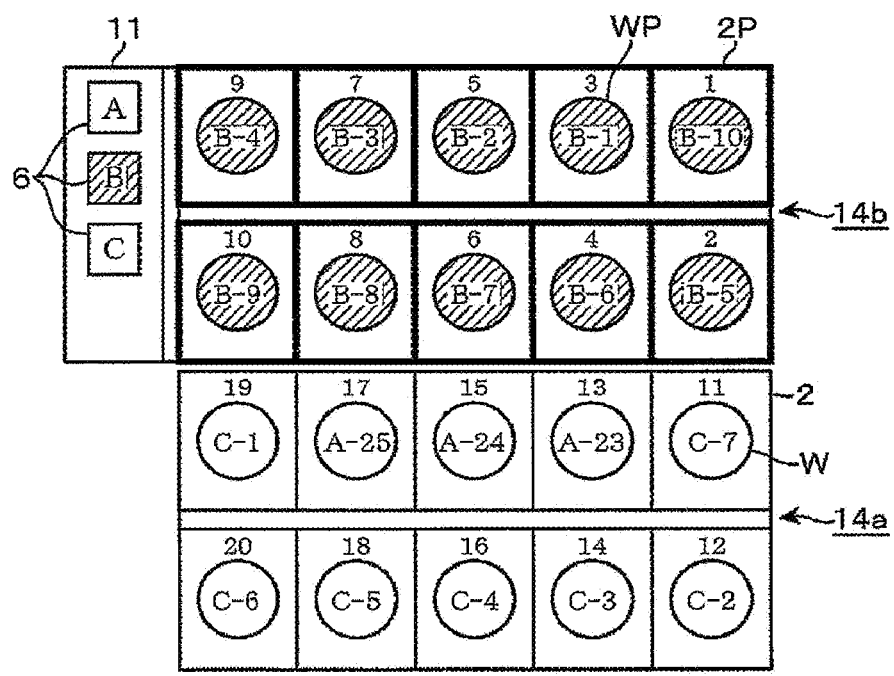
Figure 15A:
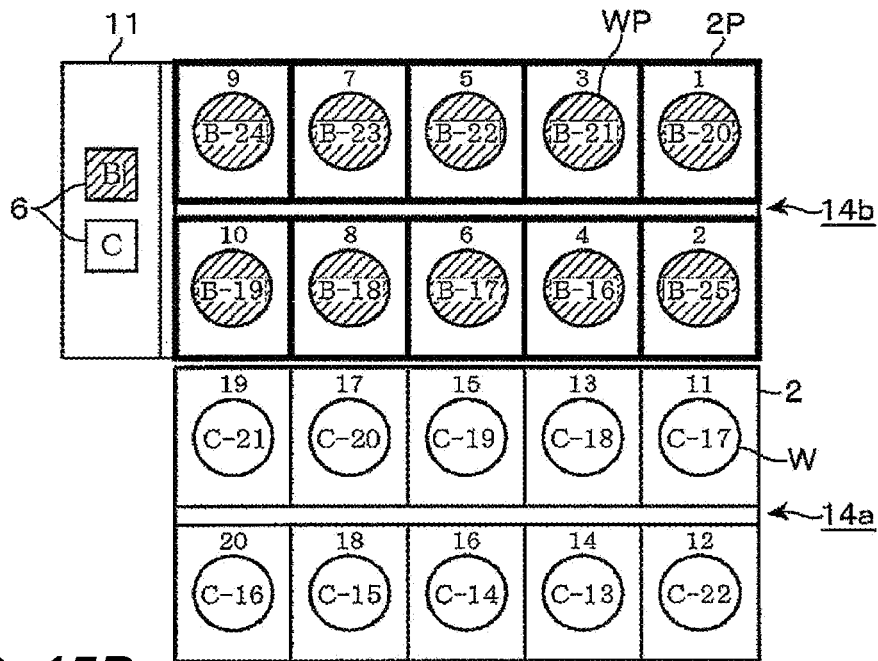
FIG. 15 is a sixth view for explaining an operation of the liquid processing apparatus.
Figure 15B:
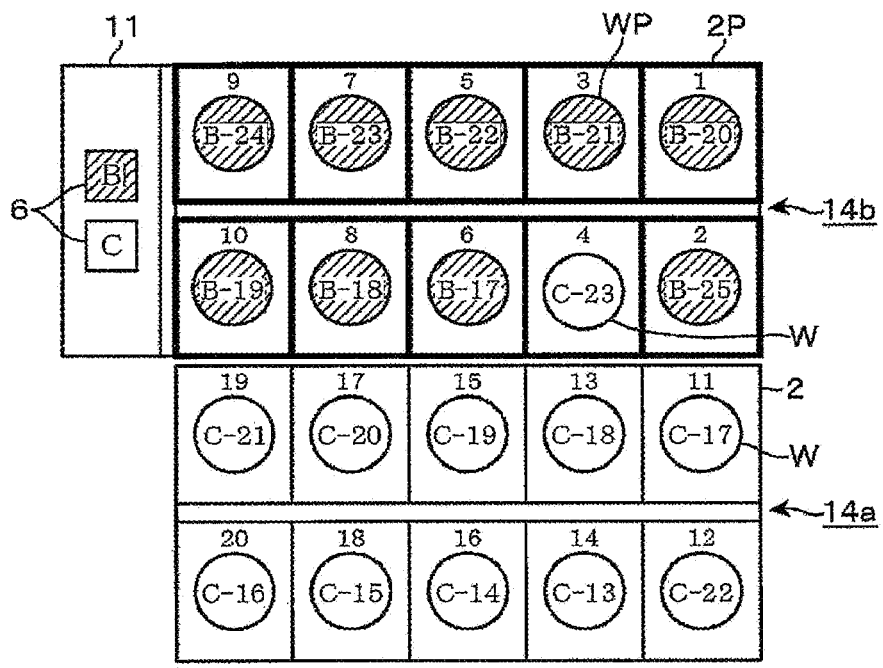

The state right after preceding processed normal wafers W are replaced by priority wafers WP in all priority processing units 2P of lower liquid processing block 14b is shown in (b) of FIG. 14. In this state, liquid processing units 2 of upper liquid processing block 14a start liquid processing for normal wafers W contained in FOUP 6(C) of normal lot, which is placed next to FOUP 6(B) of priority lot on FOUP placing unit 11. So long as there are unprocessed priority wafers WP within FOUP 6(B) of priority lot, the above operation of separately carrying priority wafers WP or normal wafers W into priority processing units 2P or normal liquid processing units 2 is continued (step S107; NO in the flowchart of FIG. 9).

Next, reference will be made in detail to a procedure of terminating processing of priority wafers WP. A state right after final 25th priority wafer WP(B-25) is carried into priority processing unit 2P(2), and then normal wafer W(C-22) is carried into liquid processing unit 2(12) of upper liquid processing block 14a is shown in (a) of FIG. 15. Subsequently, if there are priority wafers WP left in FOUP 6(B) of priority lot, then next priority wafer WP will be carried into priority processing unit 2P(4). In this embodiment, however, since there is no next unprocessed priority wafer WP to be carried into priority processing unit 2P(4), normal wafer W(C-23) is carried into priority processing unit 2P (see (b) of FIG. 15).

Figure 16A:
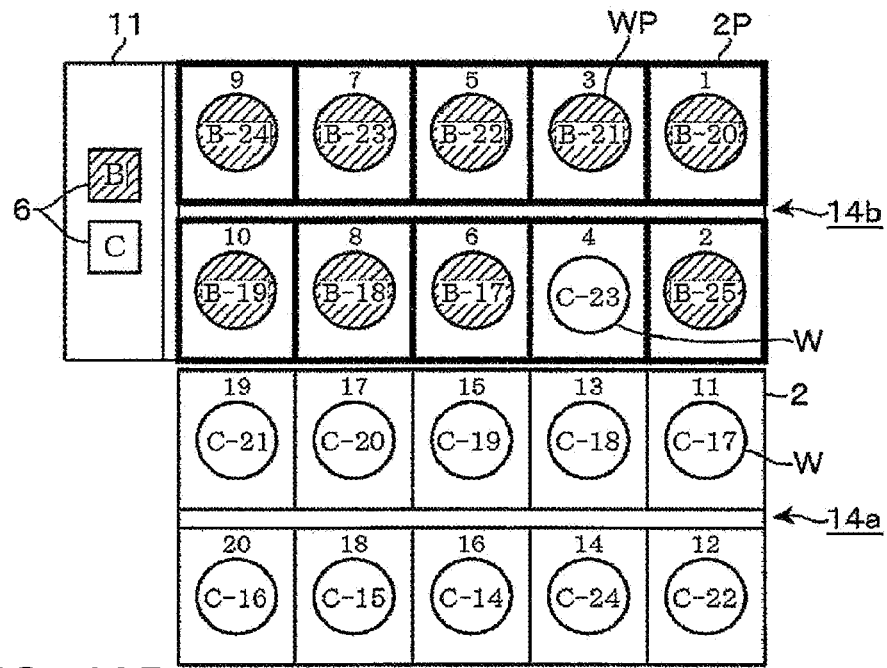
FIG. 16 is a seventh view for explaining an operation of the liquid processing apparatus.
Figure 16B:
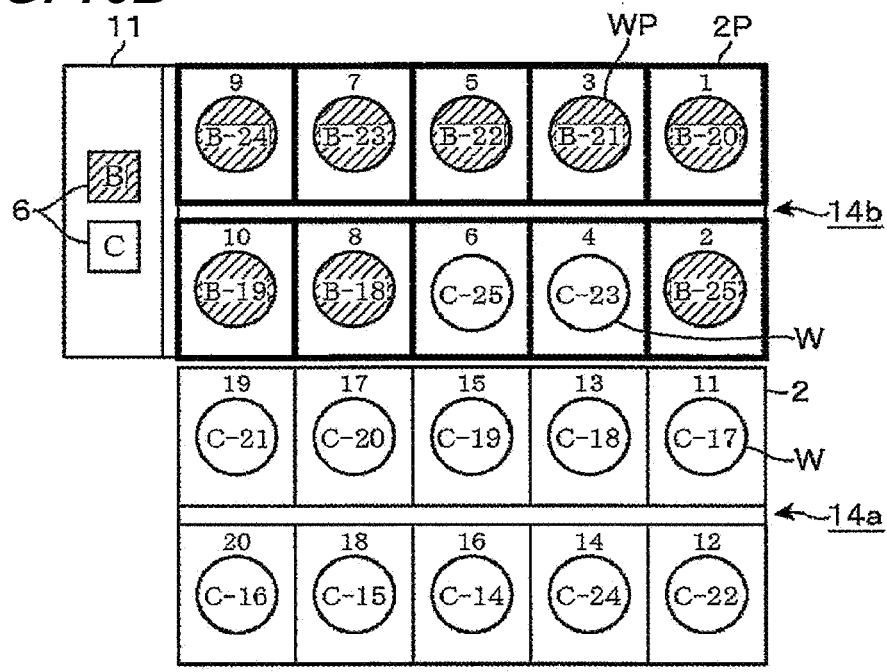

Subsequently, normal wafers W are carried into liquid processing unit 2(14) of upper liquid processing block 14a and priority processing unit 2P(6) of lower liquid processing block 14b in that order (see (a) and (b) of FIG. 16), and in this way, priority wafers WP are replaced by normal wafers W. The state just before final priority wafer WP(B-25) is carried out of priority processing unit 2P(2) is shown in (a) of FIG. 17, and in this state, liquid processing apparatus 1 starts to carry normal wafers W(D-1) to W(D-25) contained in FOUP 6(D) of normal lot.

If priority wafer WP(B-25) is carried out of priority processing unit 2P(2), and normal wafer W(D-16) is carried into priority processing unit 2P(2), processing of all priority wafers WP(B-1) to WP(B-25) within FOUP 6(B) is completed (step S107; YES in the flowchart of FIG. 9), and liquid processing units 2 are released from the assignment to priority processing units 2P, so that wafers W are carried into and subjected to a liquid processing in liquid processing units 2, based on the normal schedule (step S101).

Here, when FOUP 6(C) is also FOUP 6 of an urgent lot (priority lot), it is possible to, for example, acquire information on the number of sheets, priority information, or allowed processing time information for all priority wafers WP within a plurality of continuously carried priority lots, and assign liquid processing units 2 to priority processing units 2P by using the acquired information. Further, since there may be intermittently carried FOUPs 6 of priority lot, for example, FOUP 6(B) and FOUP 6(D), it is also possible to, for example, determine the assignment of liquid processing units 2 to priority processing units 2P for leading FOUP 6(B), and process priority wafers WP, taken out from FOUP 6(D), by using liquid processing units 2 previously assigned to priority processing units 2P, so long as liquid processing units 2 is not released from the assignment to priority processing units 2P.

Figure 17A:
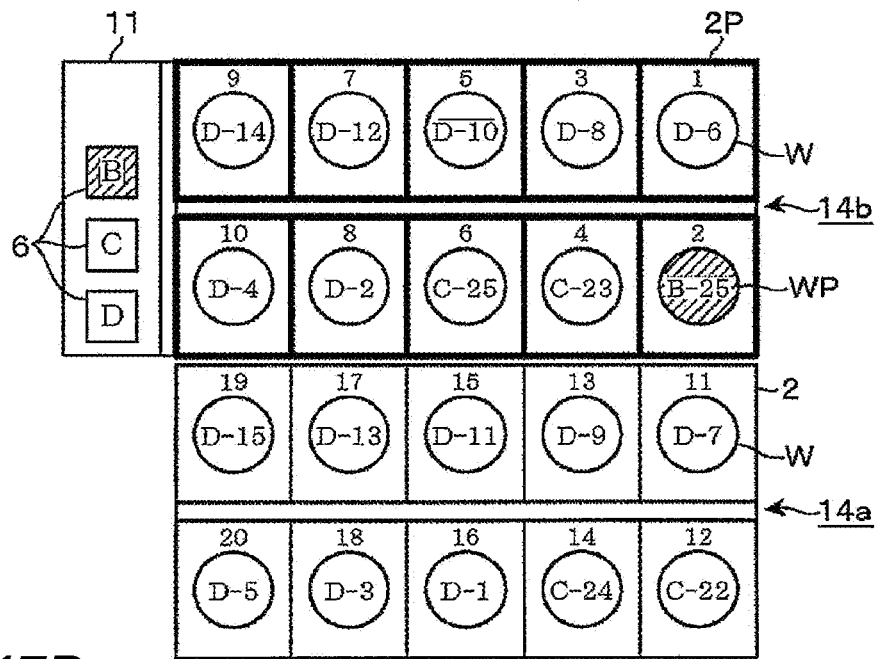
FIG. 17 is an eighth view for explaining an operation of the liquid processing apparatus.
Figure 17B:
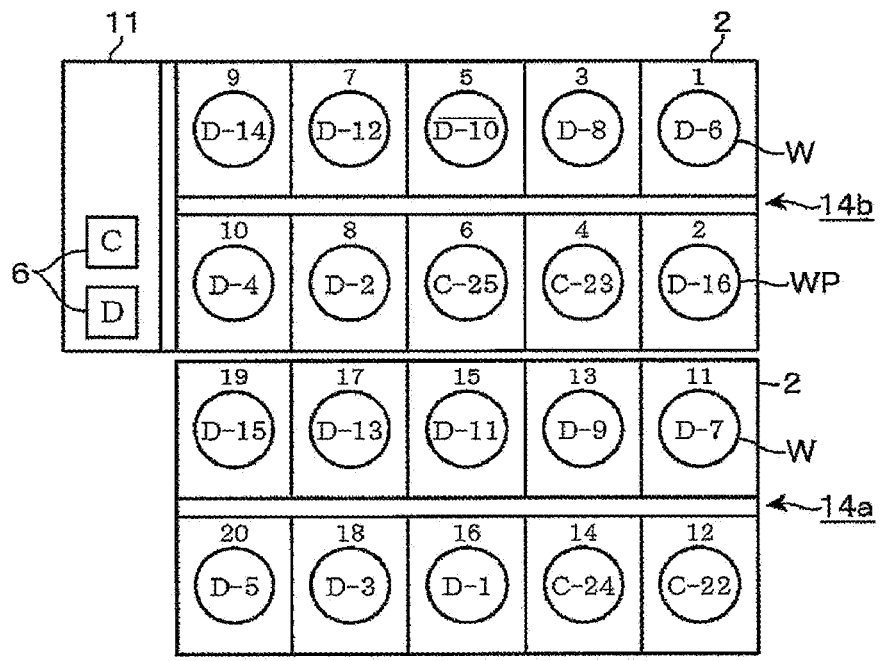
Figure 18A:
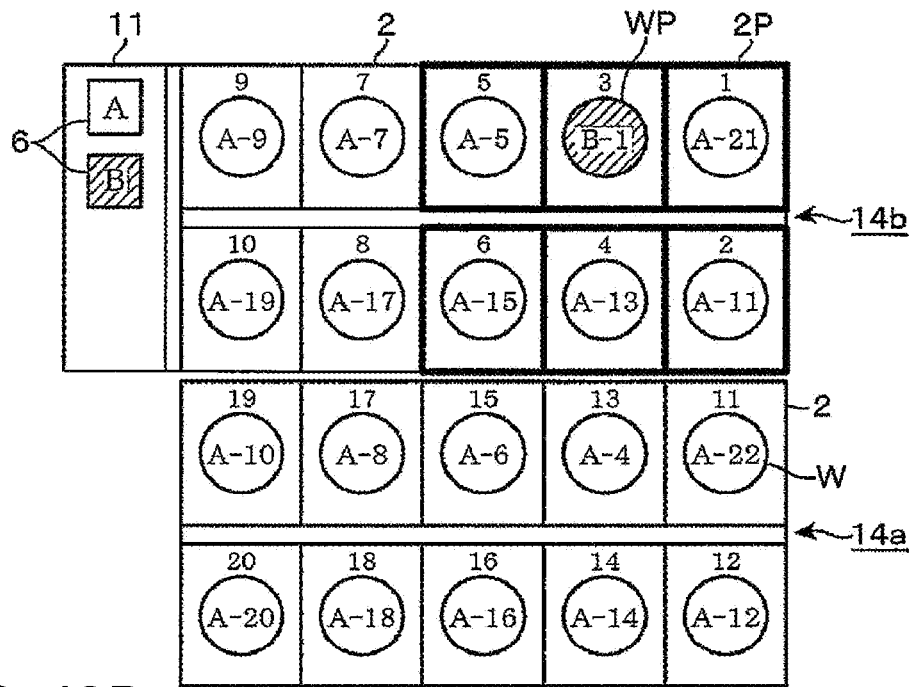
FIG. 18 is a ninth view for explaining an operation of the liquid processing apparatus.
Figure 18B:
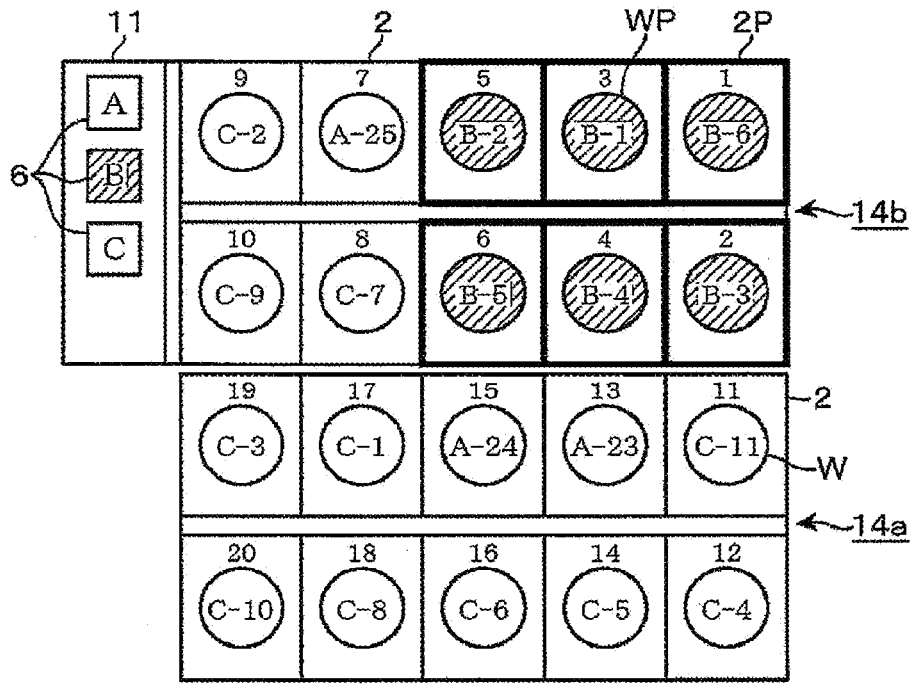

Although the example where liquid processing for priority wafers WP are performed using 10 liquid processing units 2 assigned to priority processing units 2P has been described above with reference to (b) of FIG. 12 to (a) of FIG. 17, the number of liquid processing units 2 assigned to priority processing units 2P may vary case by case. For example, when 6 liquid processing units 2 are assigned to priority processing units 2P, as shown in FIG. 6 (Case 2), liquid processing units 2 to be assigned to priority processing units 2P are determined, for example, based on the order shown in FIG. 8. Further, the state shown in (a) of FIG. 12 is followed by an operation of carrying priority wafer WP(B-1) into priority processing unit 2P(3), as shown in (a) of FIG. 18. In this way, liquid processing for priority wafers WP are performed in priority processing units 2P(1) to 2P(6) of lower liquid processing block 14b, and liquid processing for normal wafers W are performed in parallel therewith in remaining liquid processing units 2(7) to 2(20) (see (b) of FIG. 18).

Figure 19A:
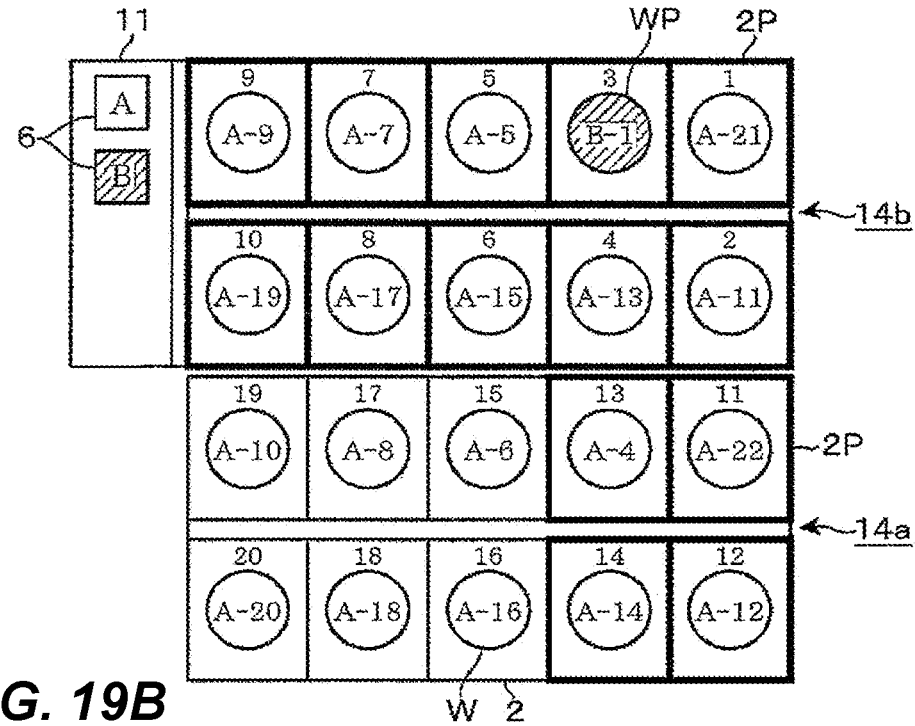
FIG. 19 is a tenth view for explaining an operation of the liquid processing apparatus.
Figure 19B:
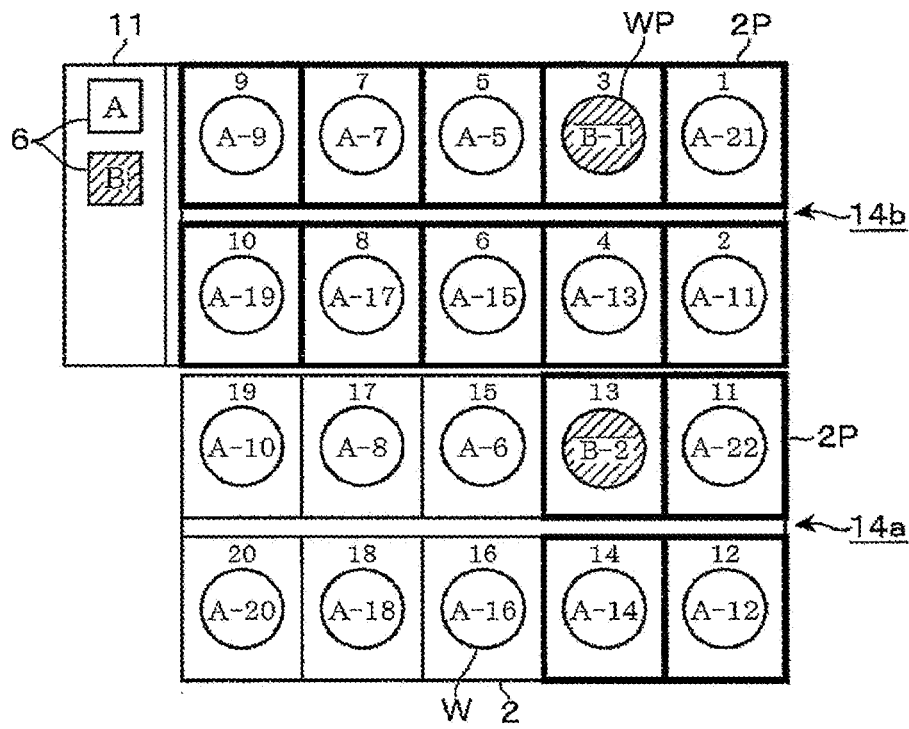
Figure 20A:
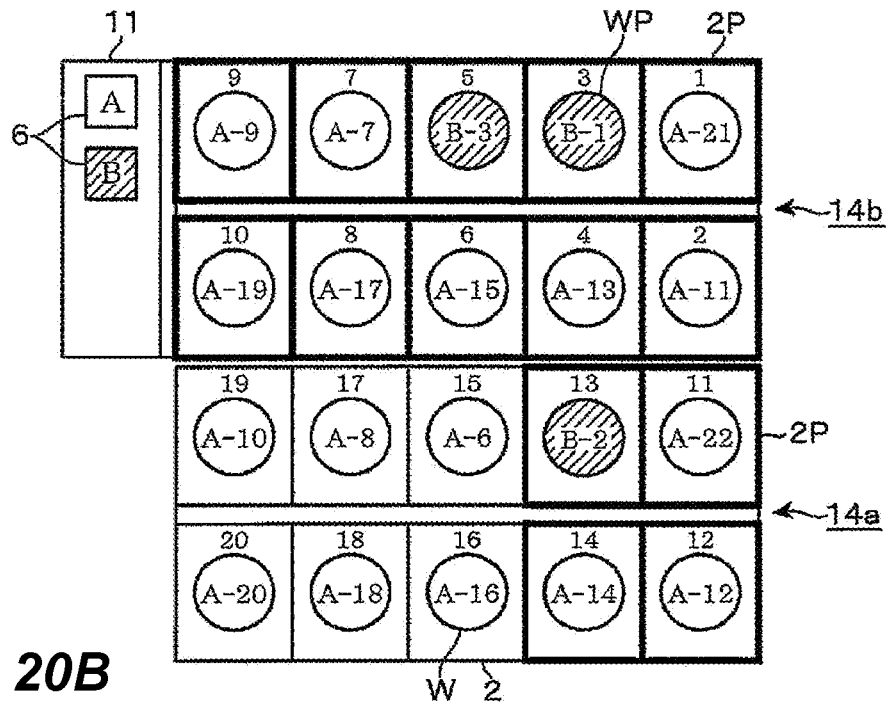
FIG. 20 is an eleventh view for explaining an operation of the liquid processing apparatus.
Figure 20B:
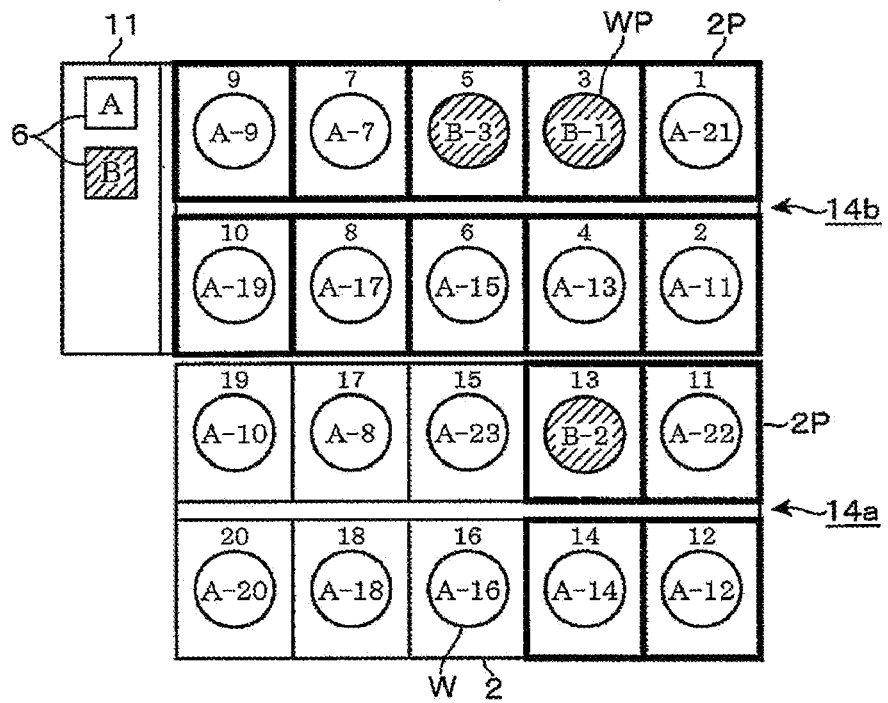

Further, (a) of FIG. 19 to FIG. 21 illustrate an example of the order in which priority wafers WP are carried into priority processing units 2P, for example, when 14 liquid processing units 2(1) to 2(14) are assigned to priority processing units 2P. In this example, as operations following the state shown in (a) of FIG. 12, priority wafer WP(B-1) is carried into priority processing unit 2P(3) of lower liquid processing block 14b (see (a) of FIG. 19), and then priority wafer WP(B-2) is carried into priority processing unit 2P(13) of upper liquid processing block 14a because a part of liquid processing units 2 of upper liquid processing block 14a are also assigned to priority processing units 2P (see (b) of FIG. 19).

Further, priority wafer WP(B-3) is carried into subsequent priority processing unit 2P(5) of lower liquid processing block 14b (see (a) of FIG. 20), but normal wafer W(A-23) is carried into next liquid processing unit 2(15) of upper liquid processing block 14a because liquid processing unit 2(15) is not assigned to priority processing unit 2P (see (b) of FIG.

20). In this way, wafers W, WP are carried into respective liquid processing units 2, 2P, and liquid processing for priority wafers WP are performed in a total of 14 priority processing units 2P(1) to 2P(14) including all liquid processing units 2(1) to 2(10) of lower liquid processing block 14*b*, innermost left and right liquid processing units 2(11), 2(12) of upper liquid processing block 14*a*, and second innermost left and right liquid processing units 2(13), 2(14) of upper liquid processing block 14*a* while liquid processing for normal wafers W are performed in parallel therewith in remaining liquid processing units 2(15) to 2(20), as shown in FIG. 21.

Further, although not shown, there may be the case where 20 liquid processing units 2 are all assigned to priority processing units 2P, as shown in FIG. 6 (Case 4). In this case, liquid processing for normal wafers W within FOUP 6(A) are stopped for the moment, and normal wafers W are replaced by priority wafers WP of a priority lot in all priority processing units 2P. After processing of the priority lot is completed in this way, liquid processing for normal wafers W within FOUP 6(A) are automatically restarted.

Effects obtained by liquid processing apparatus 1 according to this embodiment are as follows. A plurality of liquid processing units 2 capable of processing the same types of processes in parallel are partially or wholly assigned to priority processing units 2P, and priority wafers 2P, the processing of which needs to be started in preference to normal wafers W, are subjected to a liquid processing in priority processing units 2P. When other liquid processing units 2 are left, normal wafers W other than priority wafers WP can also be processed in parallel with priority wafers WP in remaining liquid processing units 2. On account of this, it is not necessary to delay the start of one of liquid processing for normal wafers W and priority wafers WP until the other liquid processing is completed or perform special operations of stopping and resuming a liquid processing for other wafers (normal wafers W) in order to perform a liquid processing for priority wafers WP, and it is possible to quickly start the liquid processing for priority substrates WP when needed.

A way to specify liquid processing units 2 to be assigned to priority processing units 2P is not limited to the example where the order of assigning liquid processing units 2 to priority processing units 2P is predetermined, as shown in FIG. 8. For example, after the number of assignments for priority processing units 2P is determined in step S104 of FIG. 9, as many liquid processing units 2 as the determined number of assignments, starting from liquid processing unit 2 in a position to receive next wafer W, may be assigned to priority processing units 2P in order of completion of their liquid processing (in other words, in order of carrying of wafers W into liquid processing units 2), as shown in (a) of FIG. 22 to FIG. 23.

Figure 22A:
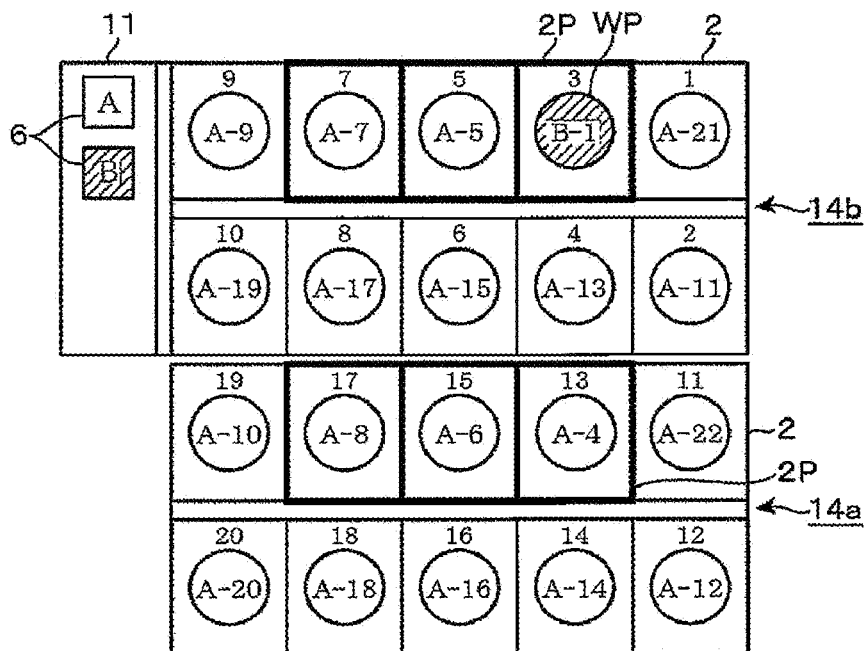
FIG. 22 is a first view for explaining an operation of a liquid processing apparatus according to another exemplary embodiment of the present disclosure.
Figure 22B:
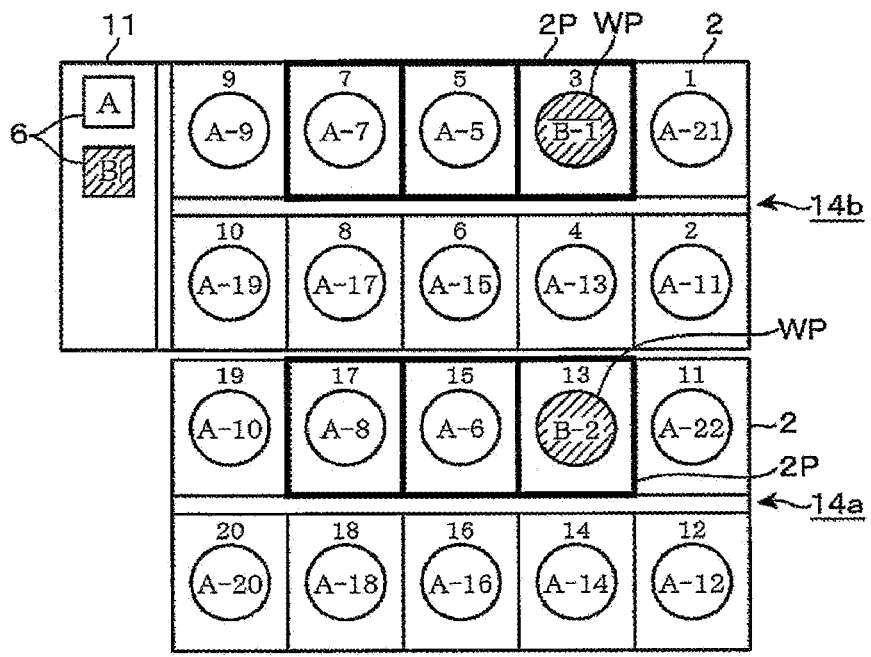
Figure 23:
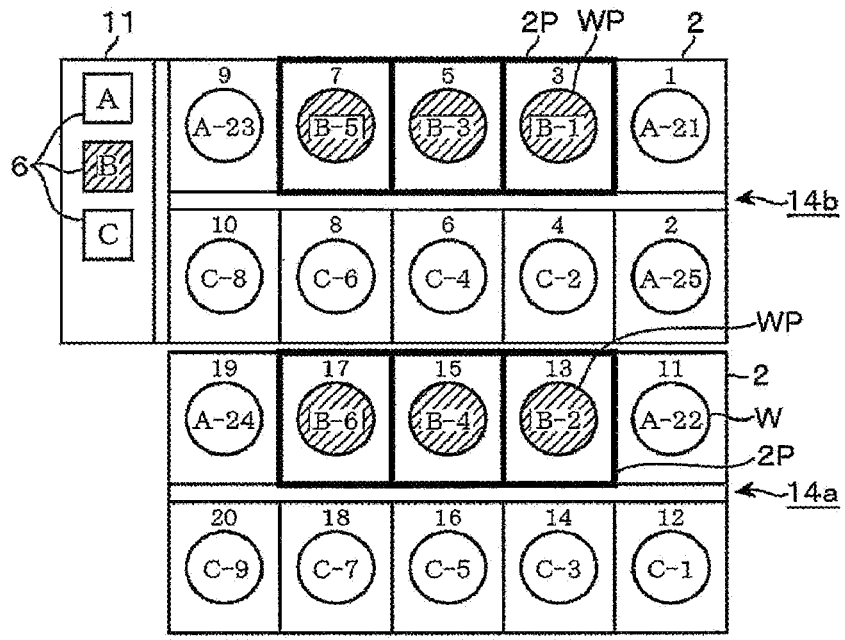
FIG. 23 is a second view for explaining an operation of the liquid processing apparatus according to another exemplary embodiment of the present disclosure.

This example of assigning liquid processing units 2 to priority processing units 2P is illustrated in (a) of FIG. 22 to FIG. 23, and these drawings show, as operations following the state shown in (a) of FIG. 12, the state where 6 liquid processing units 2 are assigned to priority processing units 2P(3), 2P(5), 2P(7), 2P(13), 2P(15), 2P(17) and priority wafers WP(B-1), WP(B-2) are carried into priority processing units 2P, which have completed the preceding liquid processing, in order of "3→13" (see (a) and (b) of FIG. 22), and the state where priority wafers WP(B-3) to WP(B-6) are carried into priority processing units 2P in order of "5→15→7→17" and then liquid processing for next FOUP 6(C) of normal lot are already started (see FIG. 23).

The unit by which liquid processing units 2 to be assigned to priority processing units 2P increase/decrease is not limited to the case where they increase/decrease by the unit of 1, as shown in FIG. 8. For example, liquid processing units 2 to be assigned to priority processing units 2P may increase/decrease by the unit of a liquid processing unit group consisting of two liquid processing units 2 that are opposite to each other with respect to carrying passages 142*a*, 142*b* (for example, liquid processing units 2(1), 2(2), liquid processing units 2(11) and 2(12), . . . ), and may also increase/decrease by the unit of a liquid processing unit group consisting of 5 liquid processing units 2 arranged along carrying passage 142*a*, 142*b* (for example, liquid processing units 2(1), 2(3), 2(5), 2(7), 2(9), liquid processing units 2(11), 2(13), 2(15), 2(17), 2(19), . . . ).

Further, although in the example shown in FIG. 6, the actual number of assignments for priority processing units 2P is obtained by multiplying the reference number of assignments for priority processing units 2P, which is selected according to the number of sheets of priority wafers WP within a priority lot, by a coefficient selected according to the priority of processing of priority wafers WP, a way to change the number of priority processing units 2P according to priority is not limited thereto. For example, the number of priority processing units 2P may be determined in such a manner that the number of assignments for priority processing units 2P is set and stored in memory 52 in correspondence to priority, and then the number of assignments, corresponding to information on priority, is read out when the priority information is acquired.

Further, although a case where priority wafers WP are carried into liquid processing units 2 not assigned to priority processing units 2P is not included in the above respective examples, these examples do not completely exclude such a case. For example, when FOUP 6(C) of normal lot is not placed on FOUP placing unit 11 after liquid processing for FOUP 6(A) of normal lot are completed as shown in (b) of FIG. 14, priority wafers WP may be carried into and subjected to a liquid processing in, for example, liquid processing units 2(19), 2(12), 2(14), 2(16), 2(18), 2(20) shown in (b) of FIG. 14.

Further, although it is assumed in the above respective examples that the same liquid processing time is required for normal wafers W and priority wafers WP, this liquid processing time may be different, for example, from lot to lot or from wafer W, WP to wafer W, WP. In contrast to the example where wafers W (priority wafers WP) are alternately carried into liquid processing units 2 (priority processing units 2P) of upper and lower liquid processing blocks 14*a*, 14*b* in order from the innermost to the front outermost, as shown in (a) of FIG. 10 to (b) of FIG. 17, this results in a change in the order of liquid processing units 2 (priority processing units 2P) capable of subsequently receiving wafer W (priority wafer WP). Even in this case, it is possible to perform liquid processing for normal wafers W and priority wafers WP in parallel by identifying whether the process unit capable of subsequently receiving wafer W (priority wafer WP) is liquid processing unit 2 or priority processing unit 2P and selecting wafer (normal wafer W or priority wafer WP) to be carried into the corresponding process unit, based on the identified liquid processing unit 2 (priority processing unit 2P). Further, when liquid processing time varies according to contents to be processed (processing types), a number of processing time estimation tables, corresponding to these processing types, are stored in memory 52.

Figure 24:
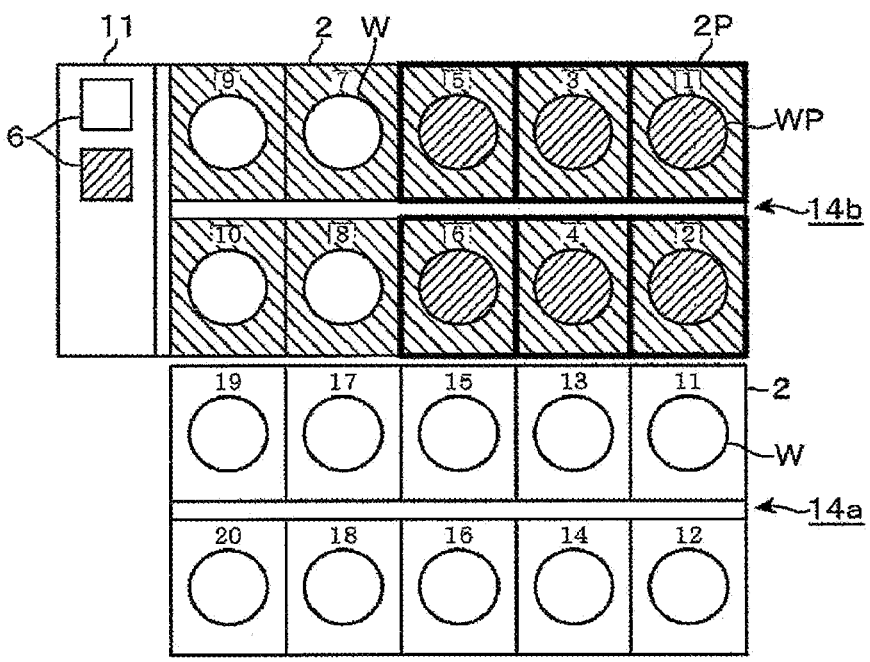
FIG. 24 is a view for explaining a liquid processing apparatus according to yet another exemplary embodiment of the present disclosure.

Further, when liquid processing apparatus includes a plurality of liquid processing units 2 capable of performing the same types of liquid processing, it may be configured such that, for example, due to piping restrictions and other problems, only a part of liquid processing units 2 can be supplied with an SC2 (a mixture solution of hydrochloric acid and hydrogen peroxide) solution for removing metal impurities, in addition to the above-mentioned DFH and SC1 solutions. In FIG. 24, liquid processing units 2(1) to 2(10) capable of this type of special liquid processing are indicated by left-upward oblique lines. With regard to this, when priority wafers WP of priority lot need to be subjected to this special liquid processing, the assignment for priority processing units 2P is performed within a range of liquid processing units 2(1) to 2(10) capable of this special liquid processing (in the example shown in FIG. 24, priority processing units 2P(1) to 2P(6)). Further, when normal wafers W also need to be subjected to this special liquid processing, they are processed in remaining liquid processing units 2 capable of this special liquid processing (in FIG. 24, liquid processing units 2(7) to 2(10)). However, when normal wafers W do not need to be subjected to this special liquid processing, a normal liquid processing is performed in all remaining liquid processing units 2(7) to 2(20).

In addition, although examples of assigning liquid processing units 2 to priority processing units 2P according to the number of sheets of wafers W, priority, or allowed processing time has been described above, the number or positions of priority processing units 2P may be unchangeable. For example, 10 liquid processing units 2(1) to 2(10) of lower liquid processing block 14b, shown in FIG. 8, may be fixed so that they can be always assigned to priority processing units 2P. Further, although liquid processing apparatus 1 has been described using the example where liquid processing blocks 14a, 14b, each of which has 10 liquid processing units 2, are disposed one above the other, it is apparent to those skilled in the art that the number of liquid processing units 2 provided in each liquid processing block 14a, 14b and the number of liquid processing blocks 14a, 14b may be appropriately increased or decreased.

Further, the same types of processes performed by liquid processing units 2 are not limited to a liquid processing, and may include all types of processes using any fluid. For example, a processing apparatus to perform a hydrophobizing process on the surface of wafer W by supplying wafer W with vapors, such as HMDS (HexaMethylDiSilazane), and other apparatuses may be covered.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a substrate carrying-in block including a carrier placing unit on which a plurality of substrate carriers each containing at least one substrate are placed, and a transfer mechanism to transfer the at least one substrate from the substrate carriers placed on the carrier placing unit;
    a processing block including a plurality of processing units to perform same types of processes for a plurality of substrates carried therein from the substrate carrying-in block and a substrate carrying unit to carry the plurality of substrates between the substrate carrying-in block and the respective processing units; and
    a control unit configured to control the substrate carrying-in block and the processing block, the control unit including a lot information acquiring unit,
    wherein the control unit controls the substrate carrying-in block and the processing block such that either a portion of the plurality of processing units or all of the plurality of processing units are assigned as priority processing units such that each of the priority processing units can receive and begin to process a priority substrate in preference to a normal substrate, and wherein the assignment of processing units as priority processing units is based on information acquired from the lot information acquiring unit including an estimated processing time required until a process for a priority substrate is completed within a processing unit assigned as a priority processing unit; and
    wherein the assigned priority processing units receive and begin to process the priority substrates and afterward the remaining processing units receive and begin to process the normal substrates, the processing of the priority and normal substrates within their respective processing units then continuing simultaneously.

2. The substrate processing apparatus as claimed in claim 1, wherein the processing units are assigned to the priority processing units after the substrate carrier containing the priority substrate is placed on the carrier placing unit.

3. The substrate processing apparatus as claimed in claim 2, wherein the number of the priority processing units varies according to the number of sheets of priority substrates.

4. The substrate processing apparatus as claimed in claim 2, further comprising a memory unit to store data for matching priority of processing of the priority substrate to the number of the priority processing units, wherein the priority is assigned to the priority substrate, and the control unit changes the number of the priority processing units according to the priority of processing of the priority substrate within the substrate carrier.

5. The substrate processing apparatus as claimed in claim 2, wherein an allowed processing time allowed to process the priority substrate is determined, and the control unit acquires the allowed processing time for the priority substrate and determines the number of the processing units to be assigned to the priority processing units in such a manner as to approximate an actual processing time to the allowed processing time, based on the estimated processing time stored in correspondence to the number of the priority processing units, and
    each of the portion of the plurality of processing units assigned as the priority processing units and each of remaining processing units not assigned as the priority processing units alternately receive one of the priority substrates and one of the normal substrates, respectively.

6. The substrate processing apparatus as claimed in claim 1, wherein the processing units to be assigned to the priority processing units is predetermined before the substrate carrier containing the priority substrate is placed on the carrier placing unit.

7. A substrate processing method comprising:
    providing a substrate carrying-in block including a carrier placing unit on which a plurality of substrate carriers each containing at least one substrate are placed, and a transfer mechanism to transfer the at least one substrate from the substrate carriers placed on the carrier placing unit;
    providing a processing block including a plurality of processing units to perform same types of processes for a plurality of substrates carried therein from the substrate carrying-in block and a substrate carrying unit to carry the plurality of substrates between the substrate carrying-in block and the respective processing units;

providing a control unit configured to control the substrate carrying-in block and the processing block, the control unit including a lot information acquiring unit;

assigning at least a portion of the plurality of processing units as priority processing units where each of the portion of the plurality of processing units can receive and begin to process a priority substrate in preference to a normal substrate, and wherein the assignment of processing units as priority processing units is based on information acquired from the lot information acquiring unit including an estimated processing time required until a process for a priority substrate is completed in a processing unit assigned as a priority processing unit;

determining whether a priority carrier including the priority substrate is placed on the carrier placing unit;

when it is determined that the priority carrier including the priority substrate is placed on the carrier placing unit, receiving the priority substrate in each of the portion of the plurality of processing units and receiving the normal substrate in each of remaining processing units not assigned as the priority processing unit; and processing the priority substrate in each of the portion of the plurality of processing units and the normal substrate in each of the remaining processing units not assigned as the priority processing unit, such that the priority substrates begin processing first and then the normal substrates being processing, the processing of priority and normal substrates then continuing simultaneously.

8. The substrate processing method as claimed in claim 7, further comprising assigning a part or all of the plurality of processing units to the priority processing units after the substrate carrier containing the priority substrate is placed on the carrier placing unit.

9. The substrate processing method as claimed in claim 7, further comprising predetermining the processing units, which are to be assigned to the priority processing units, before the substrate carrier containing the priority substrate is placed on the carrier placing unit.

10. A non-transitory computer-readable medium storing a computer program for use in a substrate processing method using a plurality of processing units to perform the same types of processes for substrates, the computer program comprising steps to execute the substrate processing method as claimed in claim 7.

* * * * *